US010636501B1

(12) United States Patent
Chen et al.

(10) Patent No.: US 10,636,501 B1
(45) Date of Patent: Apr. 28, 2020

(54) MEMORY DEVICE WITH REDUCED NEIGHBOR WORD LINE INTERFERENCE USING ADJUSTABLE VOLTAGE ON SOURCE-SIDE UNSELECTED WORD LINE

(71) Applicant: SanDisk Technologies LLC, Addison, TX (US)

(72) Inventors: Han-Ping Chen, Santa Clara, CA (US); Ching-Huang Lu, Fremont, CA (US); Vinh Diep, San Jose, CA (US); Changyuan Chen, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/356,131

(22) Filed: Mar. 18, 2019

(51) Int. Cl.
*G11C 16/34* (2006.01)
*G11C 16/08* (2006.01)
*G11C 16/16* (2006.01)
*G11C 7/04* (2006.01)
*G11C 11/56* (2006.01)
*G11C 7/10* (2006.01)
*G11C 16/24* (2006.01)
*G11C 16/28* (2006.01)

(52) U.S. Cl.
CPC ............ *G11C 16/3427* (2013.01); *G11C 7/04* (2013.01); *G11C 7/106* (2013.01); *G11C 11/5635* (2013.01); *G11C 11/5642* (2013.01); *G11C 16/08* (2013.01); *G11C 16/16* (2013.01); *G11C 16/24* (2013.01); *G11C 16/28* (2013.01); *G11C 16/3459* (2013.01)

(58) Field of Classification Search
CPC . G11C 16/3427; G11C 16/28; G11C 16/3459; G11C 11/5642; G11C 16/24; G11C 7/106; G11C 16/16; G11C 16/08; G11C 11/5635; G11C 7/04
See application file for complete search history.

(56) References Cited

U.S. PATENT DOCUMENTS

| 7,583,535 | B2 | 9/2009 | Sekar et al. |
| 7,898,864 | B2 | 3/2011 | Dong |
| 8,051,240 | B2 | 11/2011 | Dutta et al. |
| 9,336,883 | B2 | 5/2016 | Lee et al. |

(Continued)

OTHER PUBLICATIONS

U.S. Appl. No. 16/022,373, filed Jun. 28, 2019 by Lu et al.

*Primary Examiner* — Gene N Auduong
(74) *Attorney, Agent, or Firm* — Vierra Magen Marcus LLP

(57) ABSTRACT

Techniques are described for reducing program disturb including neighbor word interference in a memory device. Voltages applied to the word lines adjacent to the selected word line WLn during program and read operations are adjusted. The adjacent word lines include WLn−1, a source-side adjacent word line of WLn, and WLn+1, a drain side adjacent word line of WLn. In one aspect, VWLn−1<VWLn+1 during the verify tests of the program operation for the data states above the lowest programmed data state and VWLn−1=VWLn+1 during the verify test for the lowest programmed data state. Also, VWLn−1<VWLn+1 during a read operation which distinguishes between the programmed data states and VWLn−1=VWLn+1 during a read operation which distinguishes between erased state and the lowest programmed data state.

20 Claims, 22 Drawing Sheets

(56) References Cited

U.S. PATENT DOCUMENTS

| | | | |
|---|---|---|---|
| 9,349,478 B2 | 5/2016 | Yuan et al. | |
| 2011/0310671 A1* | 12/2011 | Lee | G11C 11/5628 |
| | | | 365/185.19 |
| 2013/0058164 A1* | 3/2013 | Moschiano | G11C 11/5642 |
| | | | 365/185.09 |
| 2015/0325309 A1* | 11/2015 | Moschiano | G11C 16/3427 |
| | | | 365/185.02 |
| 2017/0140814 A1* | 5/2017 | Puthenthermadam | ........................ |
| | | | G11C 16/3427 |
| 2019/0311772 A1* | 10/2019 | Diep | G11C 16/0483 |

* cited by examiner

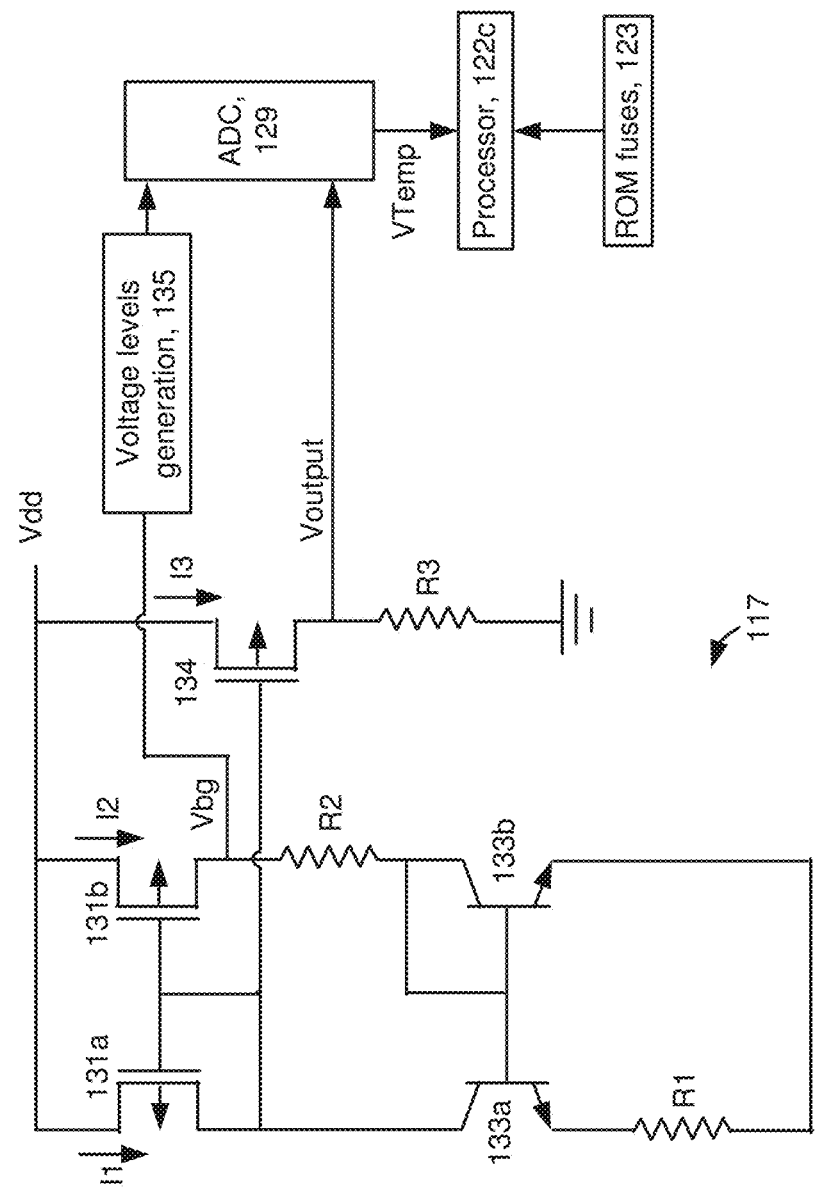

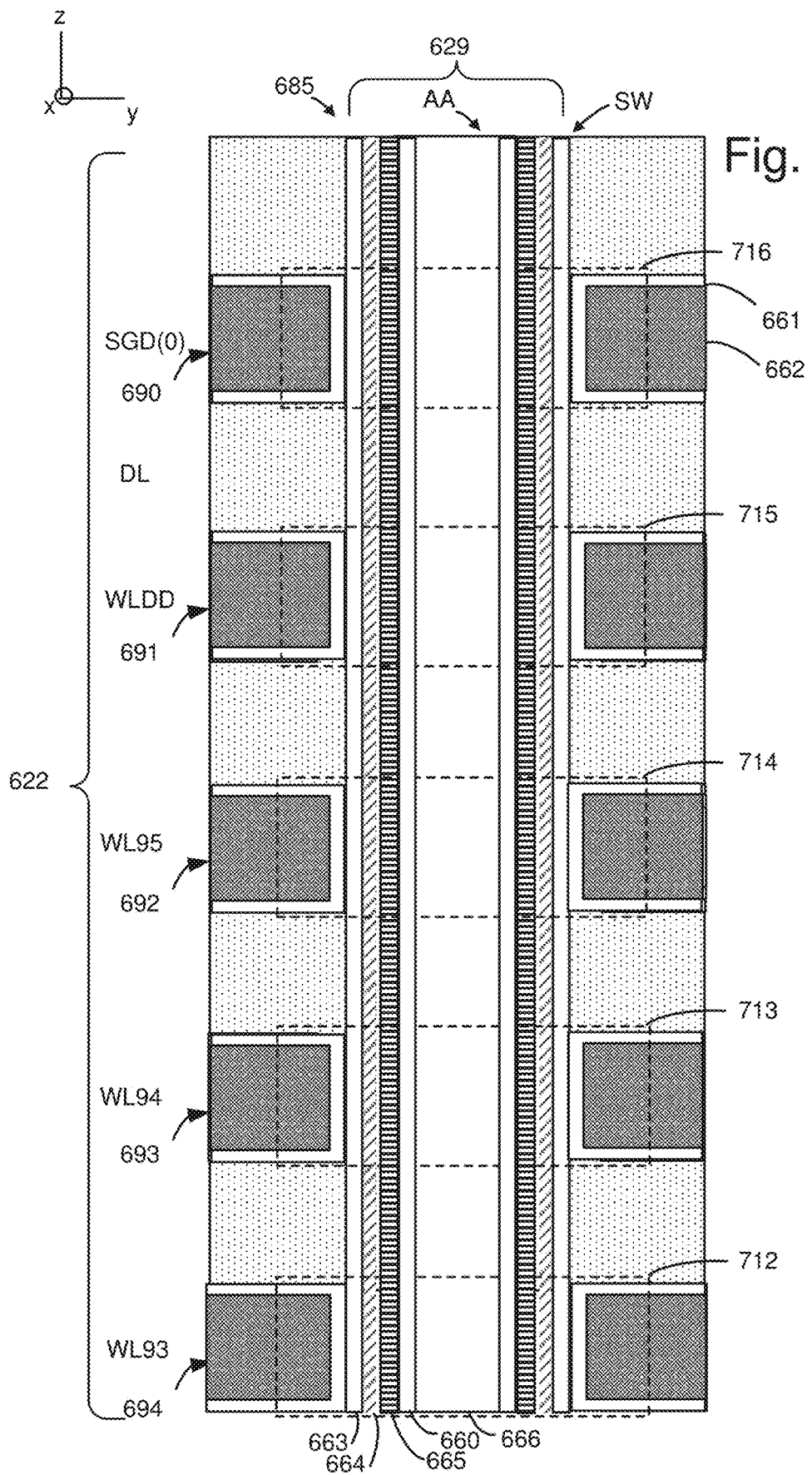

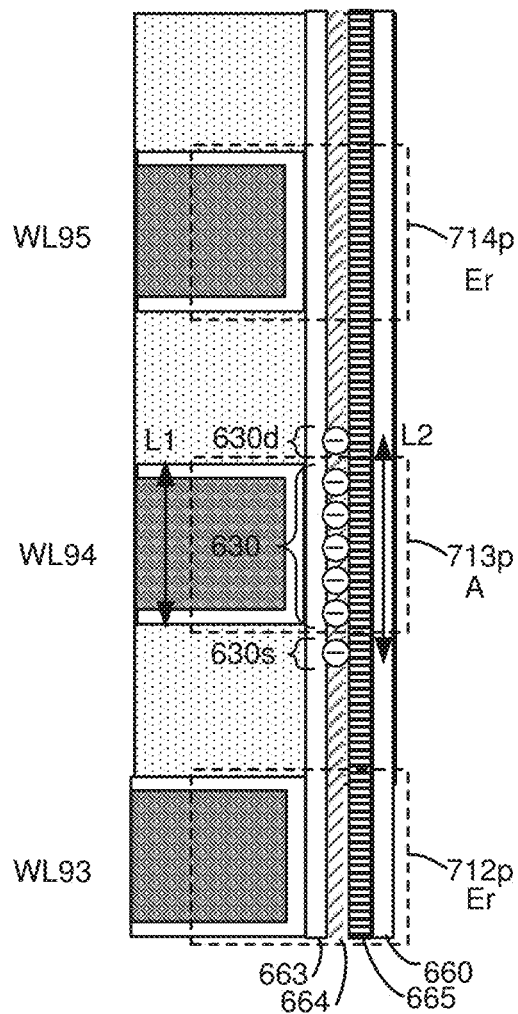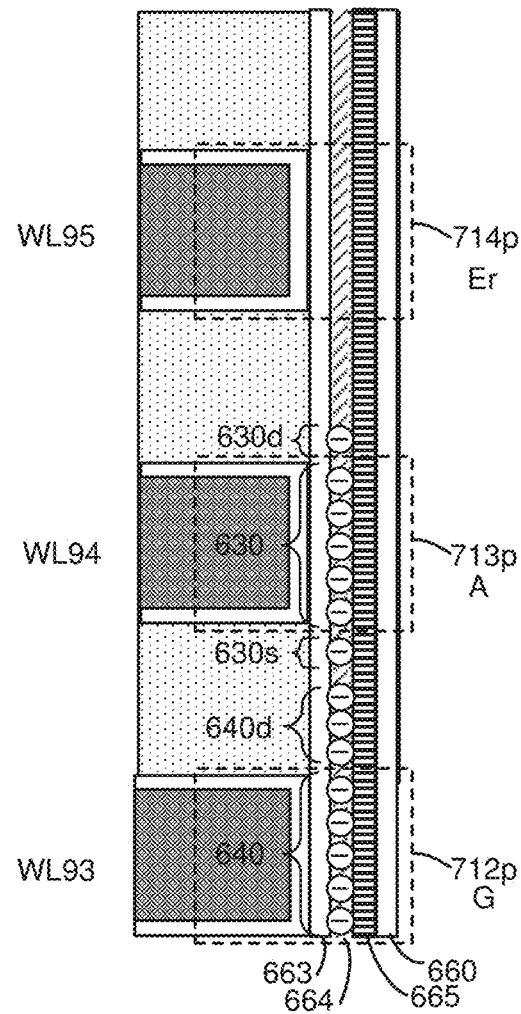

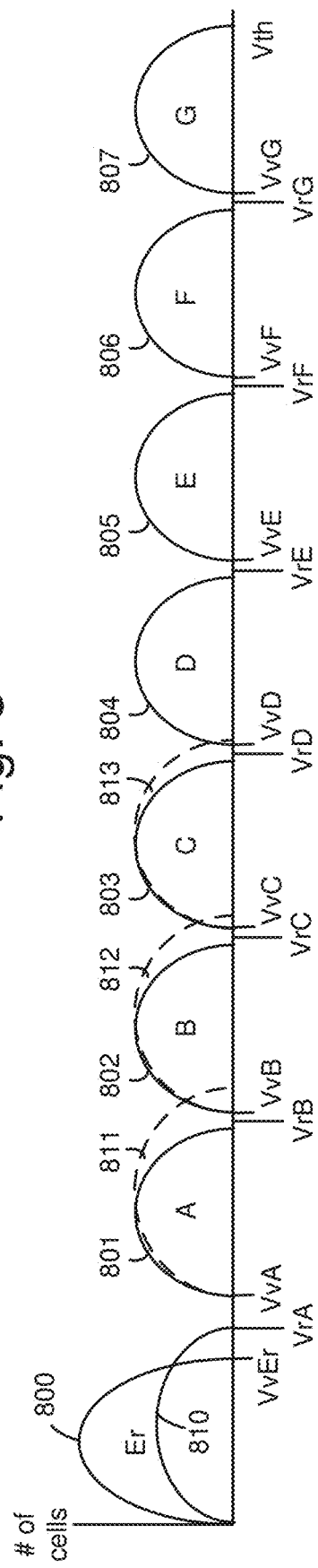

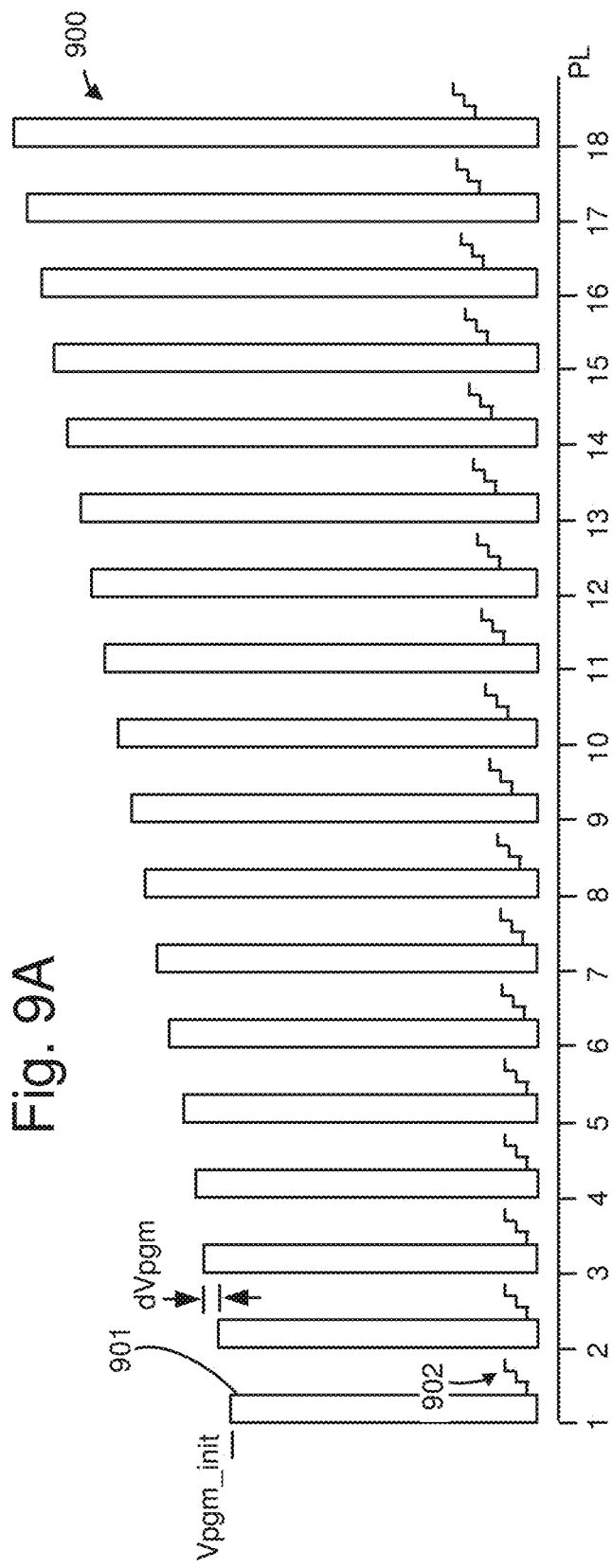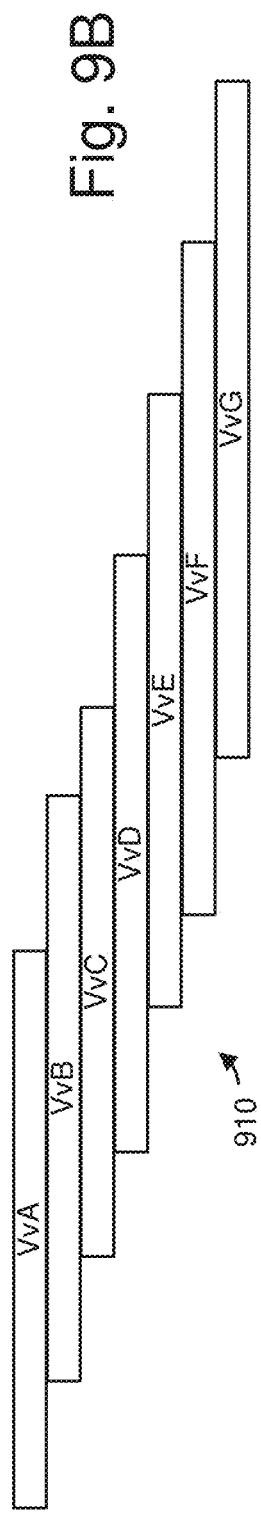

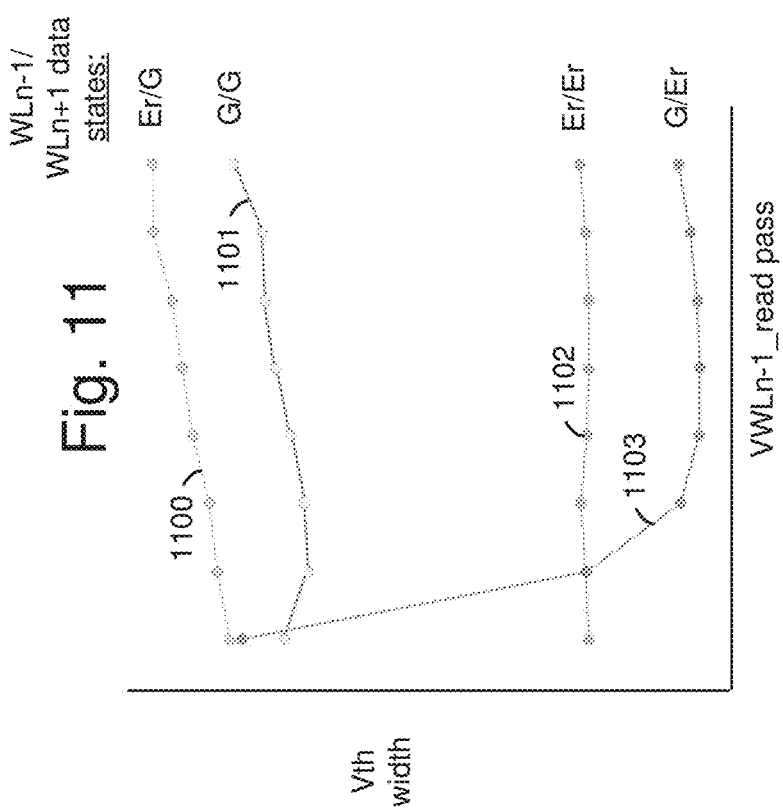
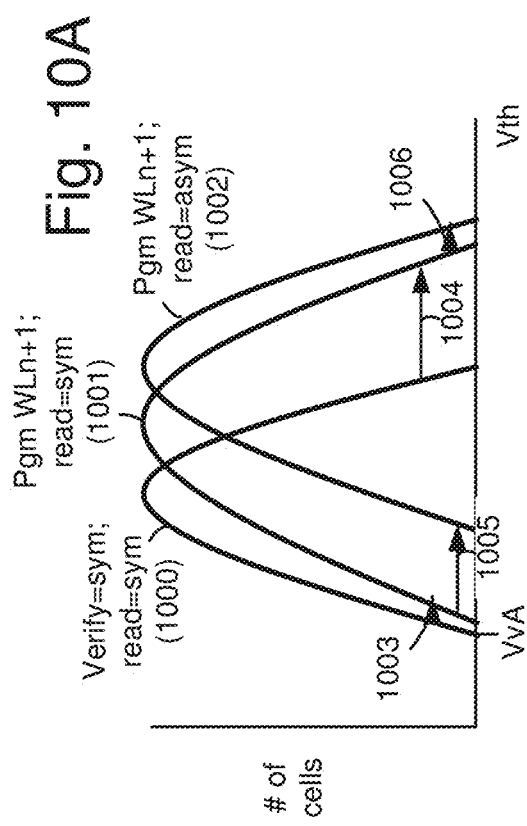
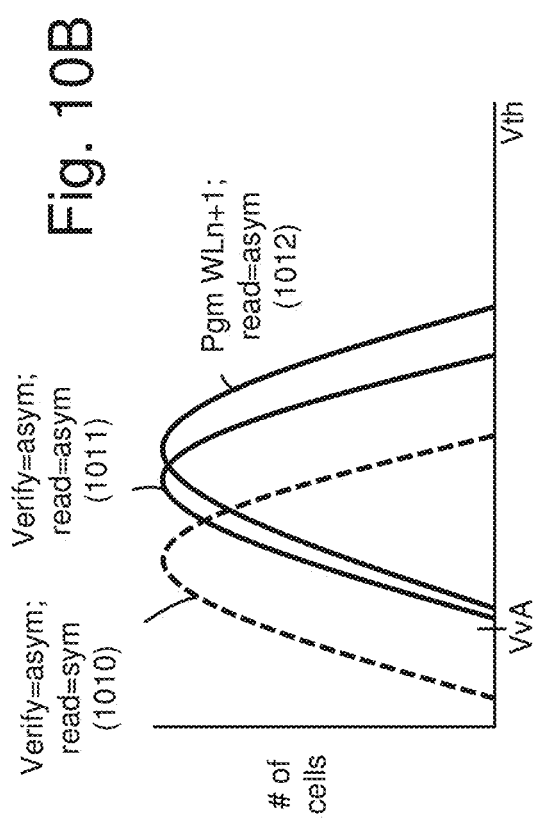

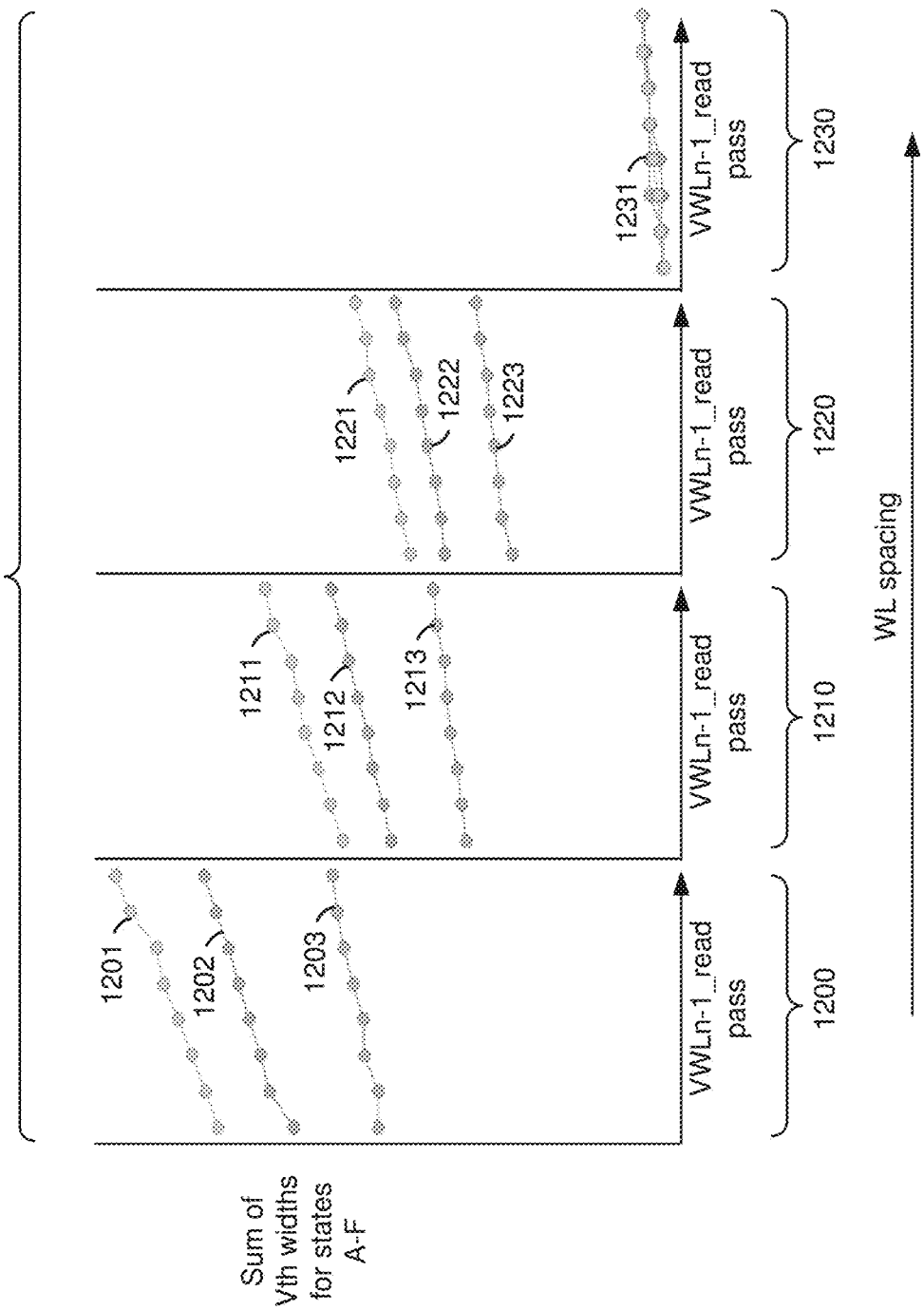

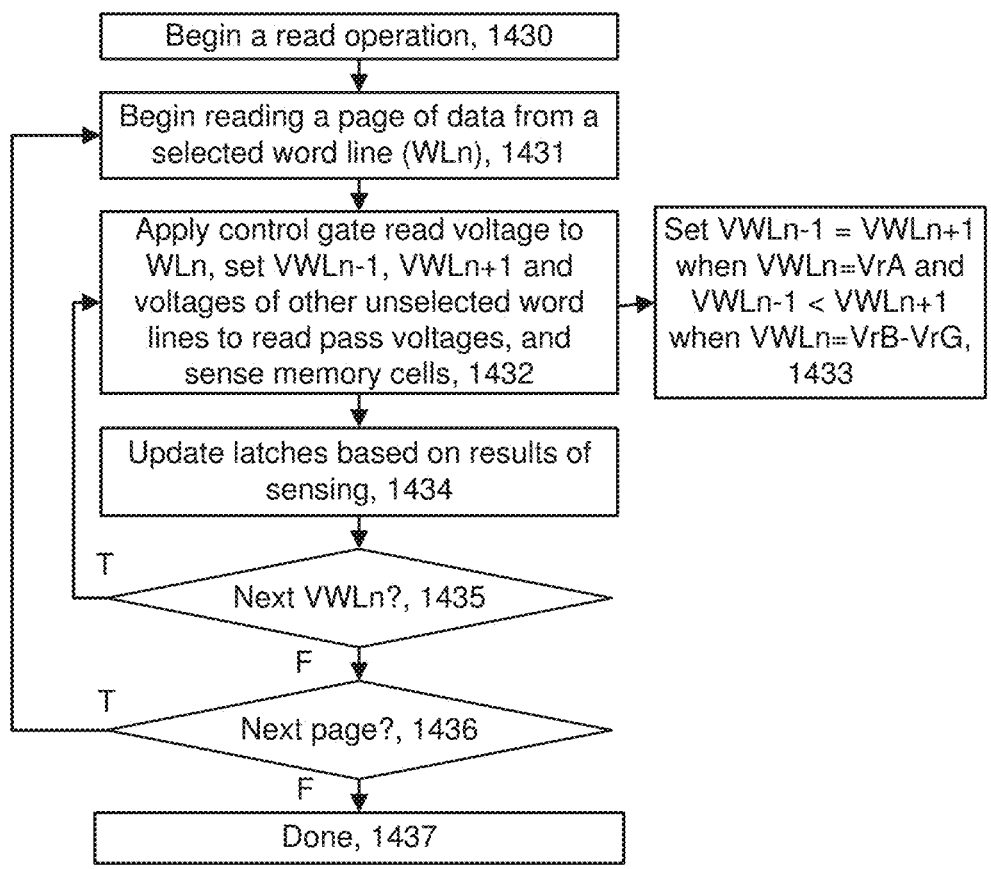

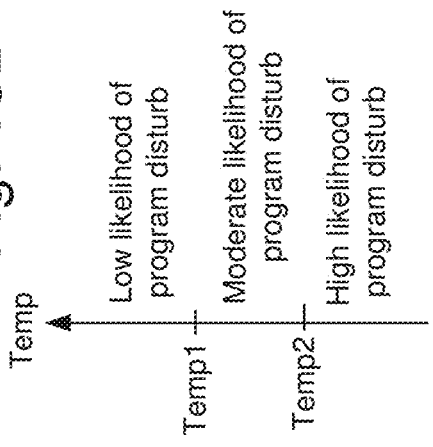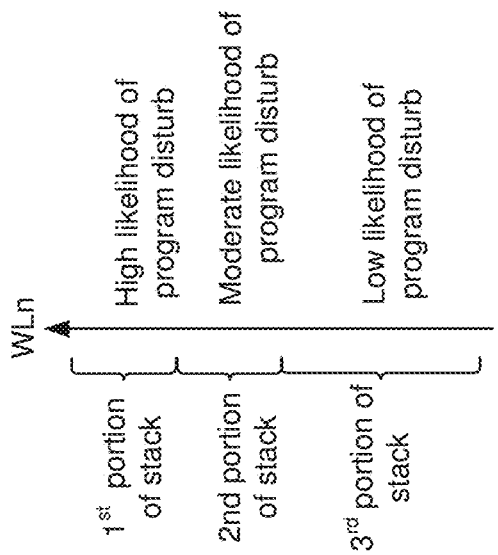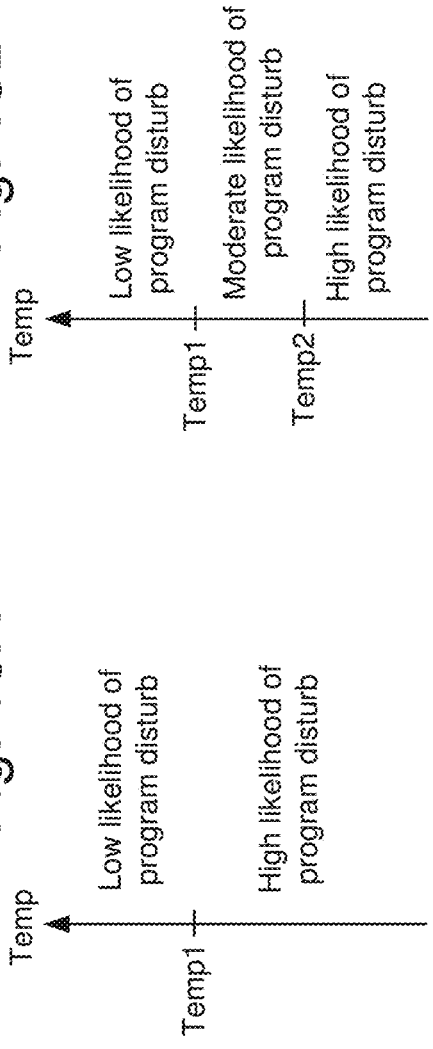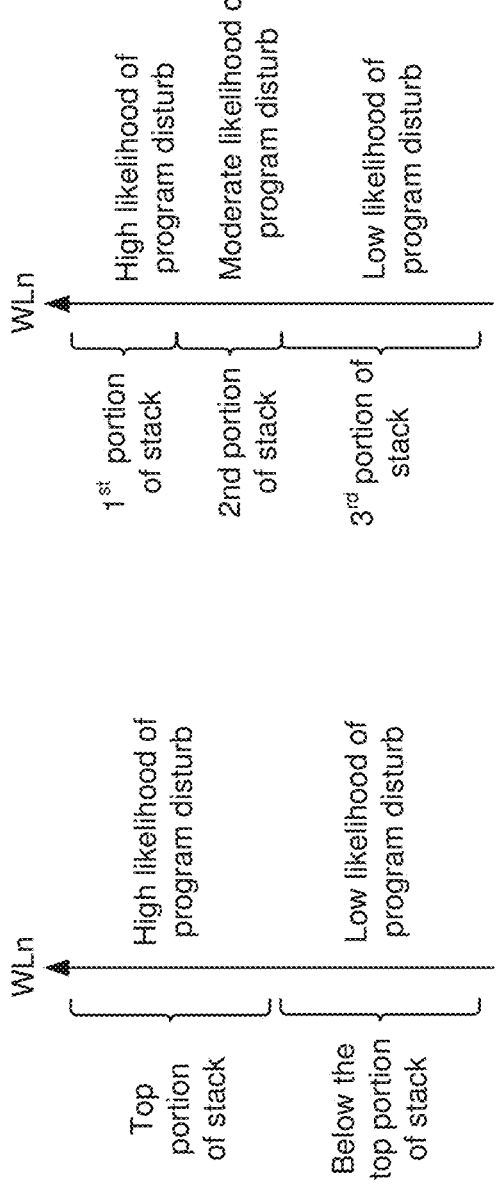

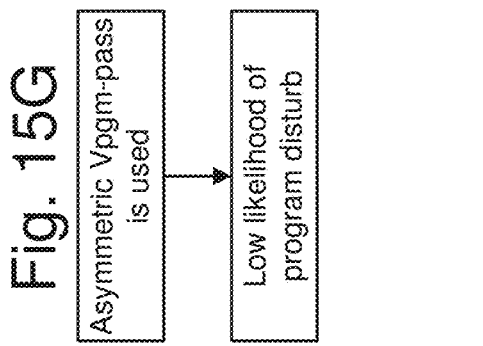
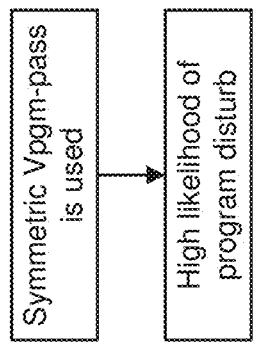
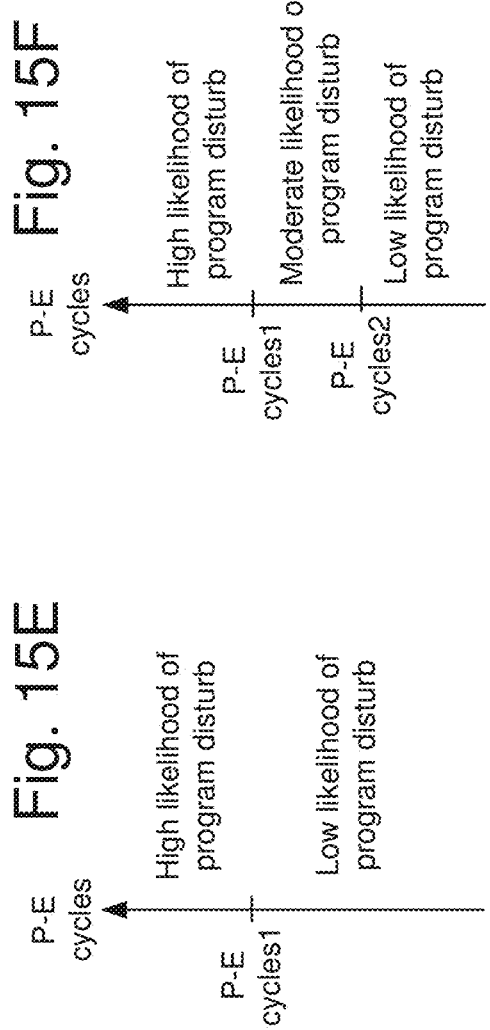
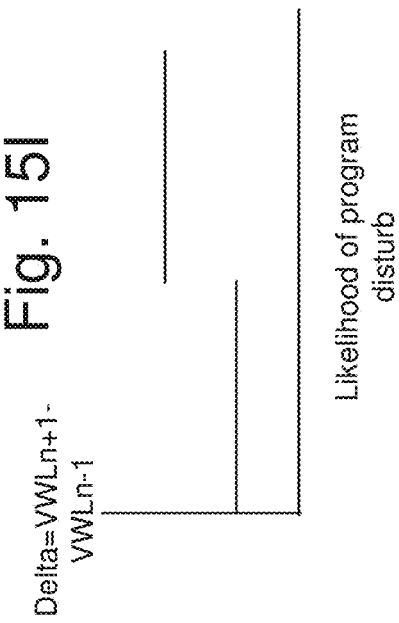

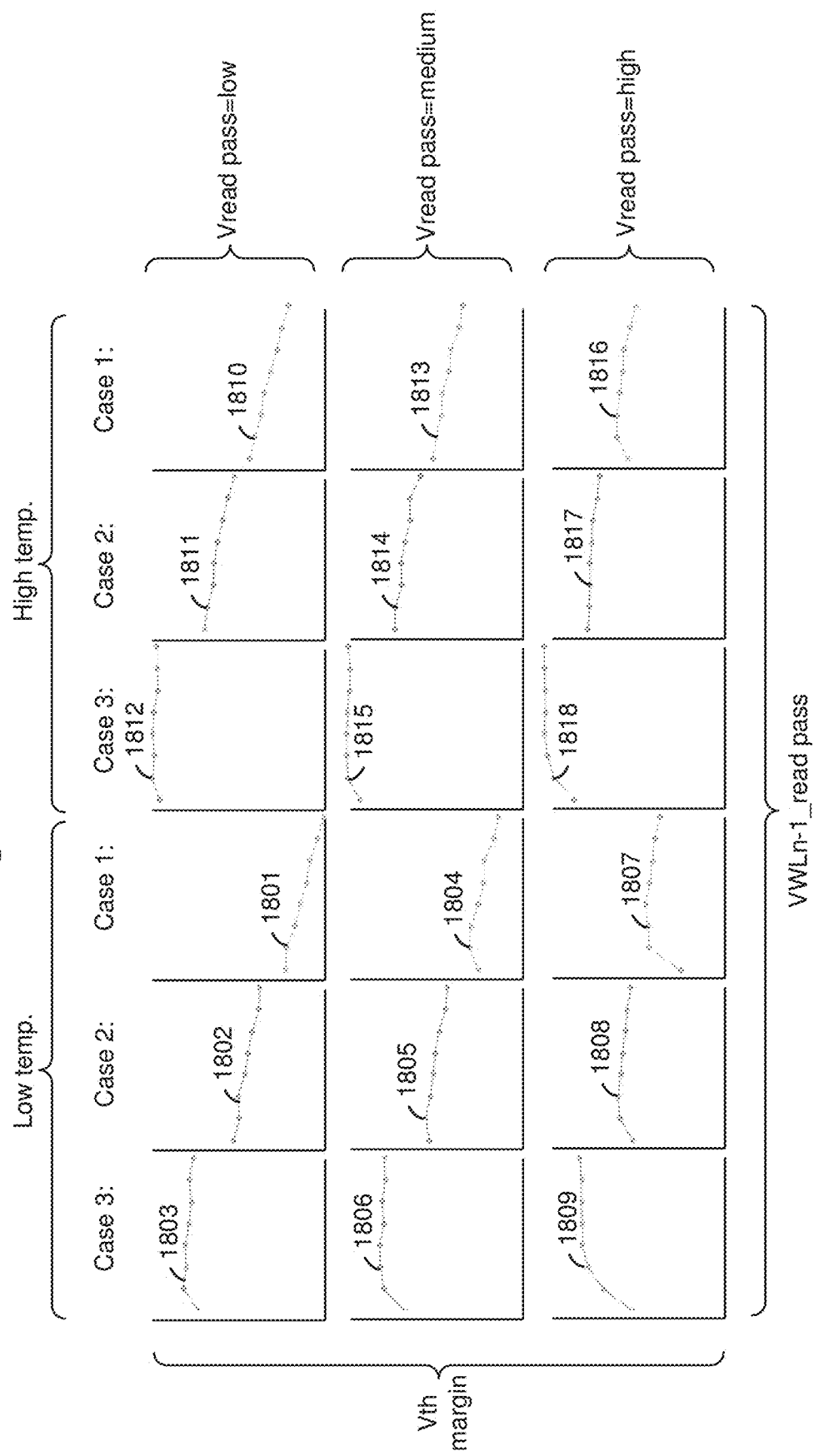

MEMORY DEVICE WITH REDUCED NEIGHBOR WORD LINE INTERFERENCE USING ADJUSTABLE VOLTAGE ON SOURCE-SIDE UNSELECTED WORD LINE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1B depicts an example of the temperature-sensing circuit 116 of FIG. 1A.

FIG. 6B depicts a close-up view of the region 622 of the stack of FIG. 6A.

FIG. 6C depicts portions 712p-714p of the memory cells 712-714, respectively, of FIG. 6B and electrons in the channels when the memory cells 712-714 are programmed to the Er, A and Er states, respectively.

FIG. 6D depicts portions of the memory cells 712-714 of FIG. 6B and electrons in the channels when the memory cells 712-714 are programmed to the G, A and Er states, respectively.

FIG. 8 depicts example Vth distributions of a set of memory cells with and without program disturb.

FIG. 9A depicts an example voltage signal in a program operation.

FIG. 9B depicts an example of verify voltages used in different program loops of FIG. 9A.

FIG. 10A depicts example Vth distributions of a set of memory cells of WLn, showing the effects of symmetric and asymmetric voltages on WLn−1 and WLn+1 during a read operation, where programming is performed using symmetric verify pass voltages.

FIG. 10B depicts example Vth distributions of a set of memory cells of WLn, showing the effects of symmetric and asymmetric voltages on WLn−1 and WLn+1 during a read operation, where programming is performed using asymmetric verify pass voltages.

FIG. 11 depicts a plot of Vth width versus VWLn−1_read pass for memory cells of WLn for different combinations of data states of memory cells of WLn−1 and WLn+1 within a NAND string.

FIG. 12 depicts plots of a sum of Vth widths for states A-F versus VWLn−1_read pass for different word line spacings.

FIG. 14B depicts an example read operation consistent with the process of FIG. 13.

FIG. 15A depicts an example of a likelihood of program disturb as a function of temperature.

FIG. 15B depicts another example of a likelihood of program disturb as a function of temperature.

FIG. 15C depicts an example of a likelihood of program disturb as a function of the position of WLn in a stack.

FIG. 15D depicts another example of a likelihood of program disturb as a function of the position of WLn in a stack.

FIG. 15E depicts an example of a likelihood of program disturb as a function of a number of program-erase cycles.

FIG. 15F depicts another example of a likelihood of program disturb as a function of a number of program-erase cycles.

FIG. 15G depicts an example of a low likelihood of program disturb when asymmetric Vpgm-pass is used.

FIG. 15H depicts an example of a high likelihood of program disturb when symmetric Vpgm-pass is used.

FIG. 15I depicts an example plot showing a delta=VWLn−1−VWLn+2 as a function of a likelihood of program disturb.

FIG. 16A depicts voltages applied to a selected word line.

FIG. 16B depicts voltages applied to unselected word lines.

FIG. 16C depicts voltages applied to select gate transistors.

FIG. 16D depicts voltages applied to bit lines.

FIG. 17A depicts voltages applied to a selected word line.

FIG. 17B depicts voltages applied to unselected word lines.

FIG. 17C depicts voltages applied to select gate transistors.

FIG. 17D depicts voltages applied to bit lines.

FIG. 18 depicts plots of Vth margin versus VWLn−1_read pass for low and high temperatures, for low, medium and high levels of Vread pass, and for the three cases discussed in connection with FIG. 12.

DETAILED DESCRIPTION

Figure 1A:
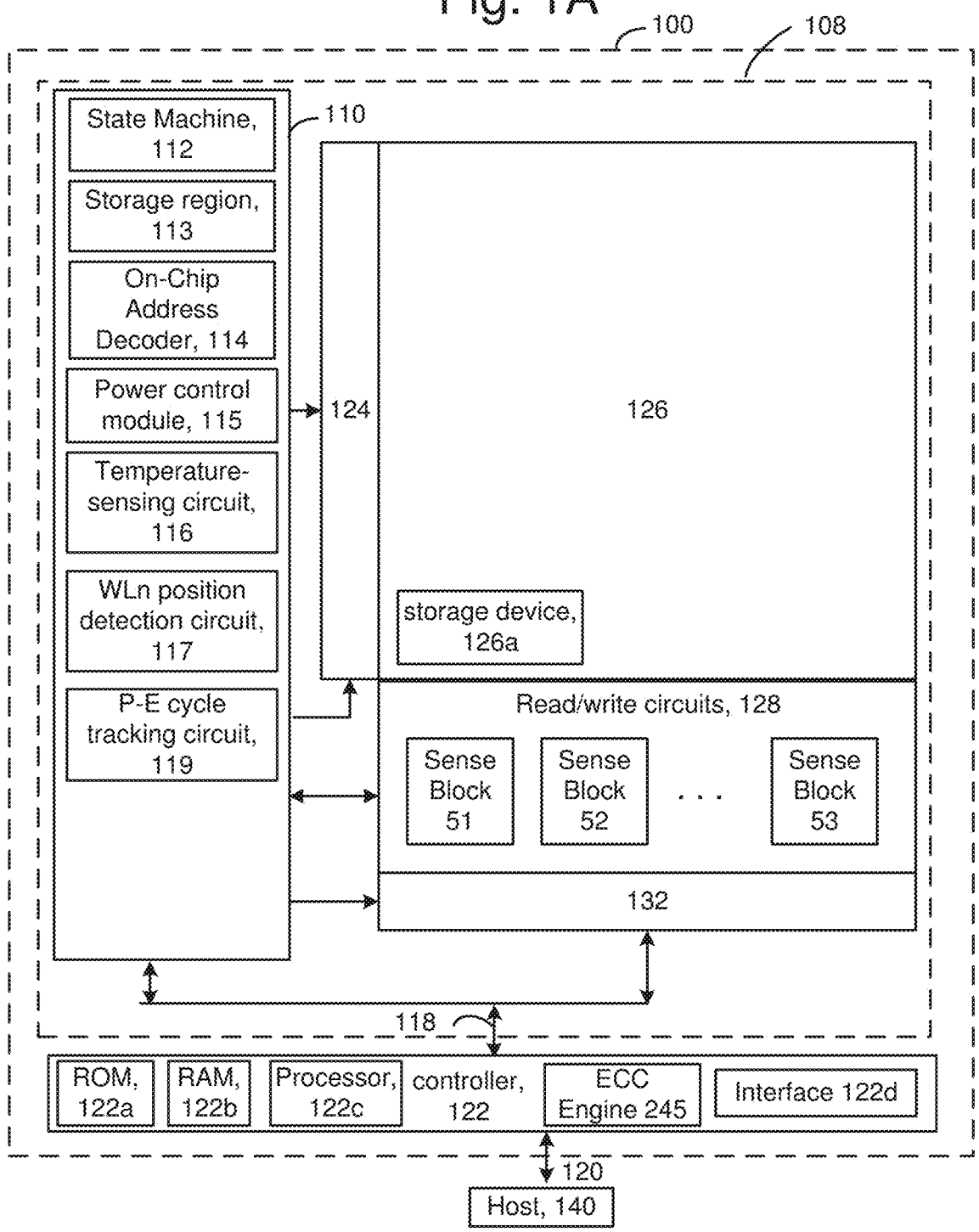
FIG. 1A is a block diagram of an example memory device.

Apparatuses and techniques are described for reducing program disturb in a memory device.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages or pulses which are applied to the word line in respective program loops or program-verify iterations, such as depicted in FIG. 9A. Verify tests may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 8). In a four-bit per cell memory device, there are sixteen data states including the erased state and fifteen higher data states. The data states may be referred to as the S0-S15 data states where S0 is the erased state. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn.

However, the Vth of a memory cell can change due to program disturb. Program disturb refers to inadvertent programming of memory cells. One form of program disturb is neighbor word line interference (NWI), discussed further, e.g., in connection with FIG. 6C-6F. When the memory cells of a word line WLn+1 are programmed, parasitic cells can be formed between WLn+1 and WLn. This causes the Vth of the memory cells of WLn to be higher when they are read compared to when they were programmed. This can result in read errors.

Techniques provided herein address the above and other issues by adjusting the voltages applied to the word lines adjacent to the selected word line during program and read operations. The adjacent word lines include WLn−1, a source-side adjacent word line of WLn, and WLn+1, a drain side adjacent word line of WLn. In one aspect, VWLn−1 (the voltage applied to WLn−1) and VWLn+1 (the voltage applied to WLn+1) are symmetric, e.g., equal or not differing by more than a specified delta, with VWLn−1<VWLn+1, at some times, and asymmetric, e.g., differing by more than a specified delta, with VWLn−1=VWLn+1, at other times. In an example NWI countermeasure, VWLn−1=VWLn+1 during a verify test for the lowest programmed data state, e.g., the A state (but not for higher programmed data states), and during a read operation which distinguishes between the erased state and the lowest programmed data state (but not between programmed data states). Additionally, VWLn−1<VWLn+1 during a verify test for the remaining programmed data states, e.g., the B-G states (but not the lowest programmed data state), and during a read operation which distinguishes between the programmed data states (but not between the erased state and the lowest programmed data state).

In another aspect, the NWI countermeasure described here can be imposed in situations where program disturb is more likely to occur. For example, the NWI countermeasure may be imposed when an ambient temperature of the memory device is below a threshold temperature, when the position of WLn is close to the top of the stack and/or to the drain ends of the NAND strings and/or when VWLn−1 and VWLn+1 are symmetric during the application of the program pulses in the program operation.

These and other features are discussed further below.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a power control module 115 (power control circuit), a temperature-sensing circuit 116, a WLn position detection circuit 117, and a P-E cycle tracking circuit 119. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The temperature-sensing circuit 116 can detect a temperature of the memory device at the time of a program or read operation, for use in connection with FIGS. 15A and 15B. The WLn position detection circuit 117 can detect a position of the selected word line, such as by determining its relative position in a stack, for use, e.g., in connection with FIGS. 15C and 15D. The P-E cycle tracking circuit 119 can track a number of P-E cycles which are accumulated over time by a block or other set of memory cells for use, e.g., in connection with FIGS. 15E and 15F.

See FIG. 1B for an example implementation of the temperature-sensing circuit. The temperature-sensing circuit, program loop tracking circuit, P-E cycle tracking circuit, and transition parameter circuit may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, temperature-sensing circuit 116, WLn position detection circuit 117, P-E cycle tracking circuit 119, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below.

A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 116 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122c. This is data indicating a temperature of the memory device. ROM fuses 123 store data which correlates the matching voltage level to a temperature, in one approach. The processor then uses the temperature to set temperature-based parameters in the memory device such as by using the transition parameter circuit.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
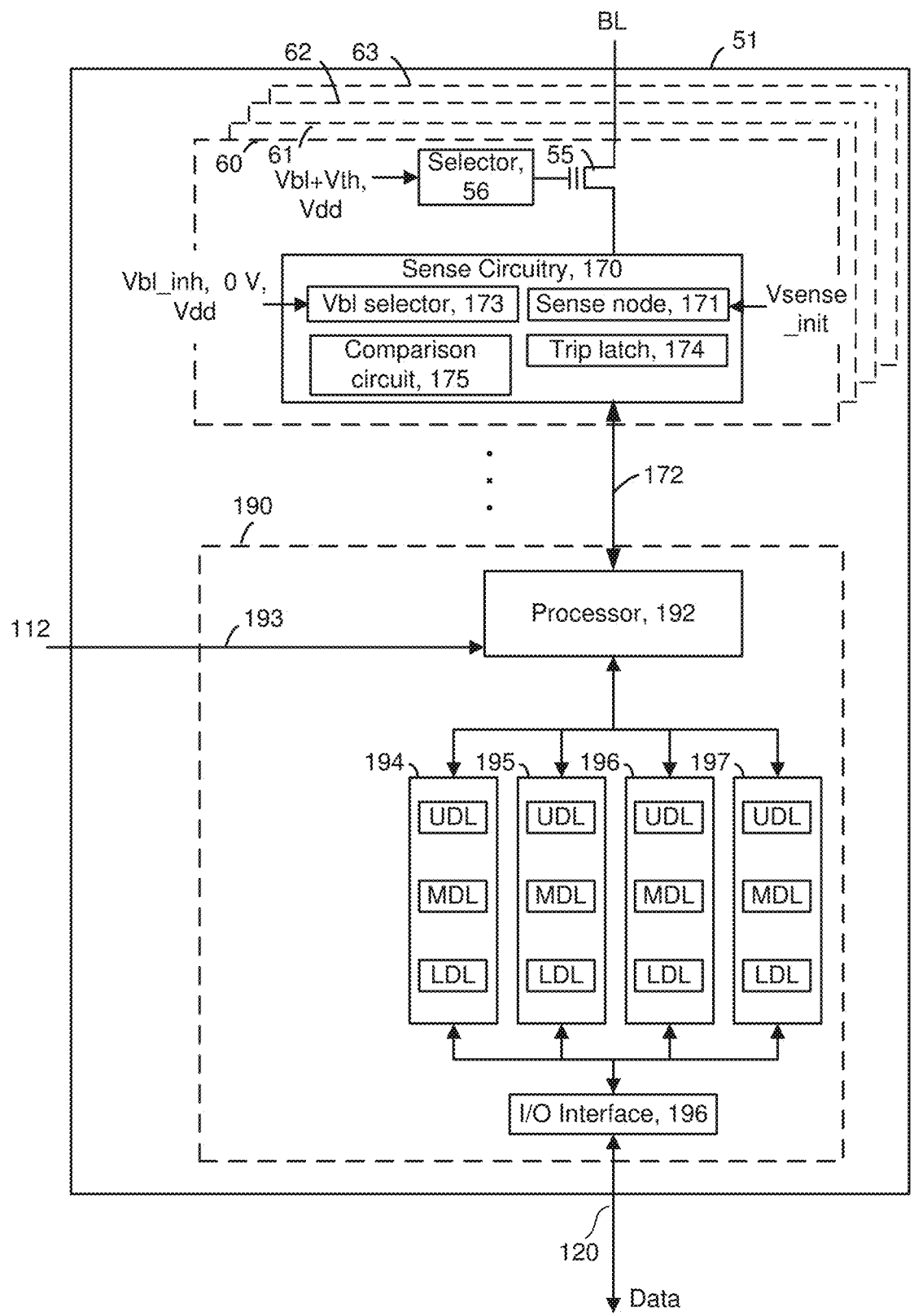
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_inh (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per memory cell memory device.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3:
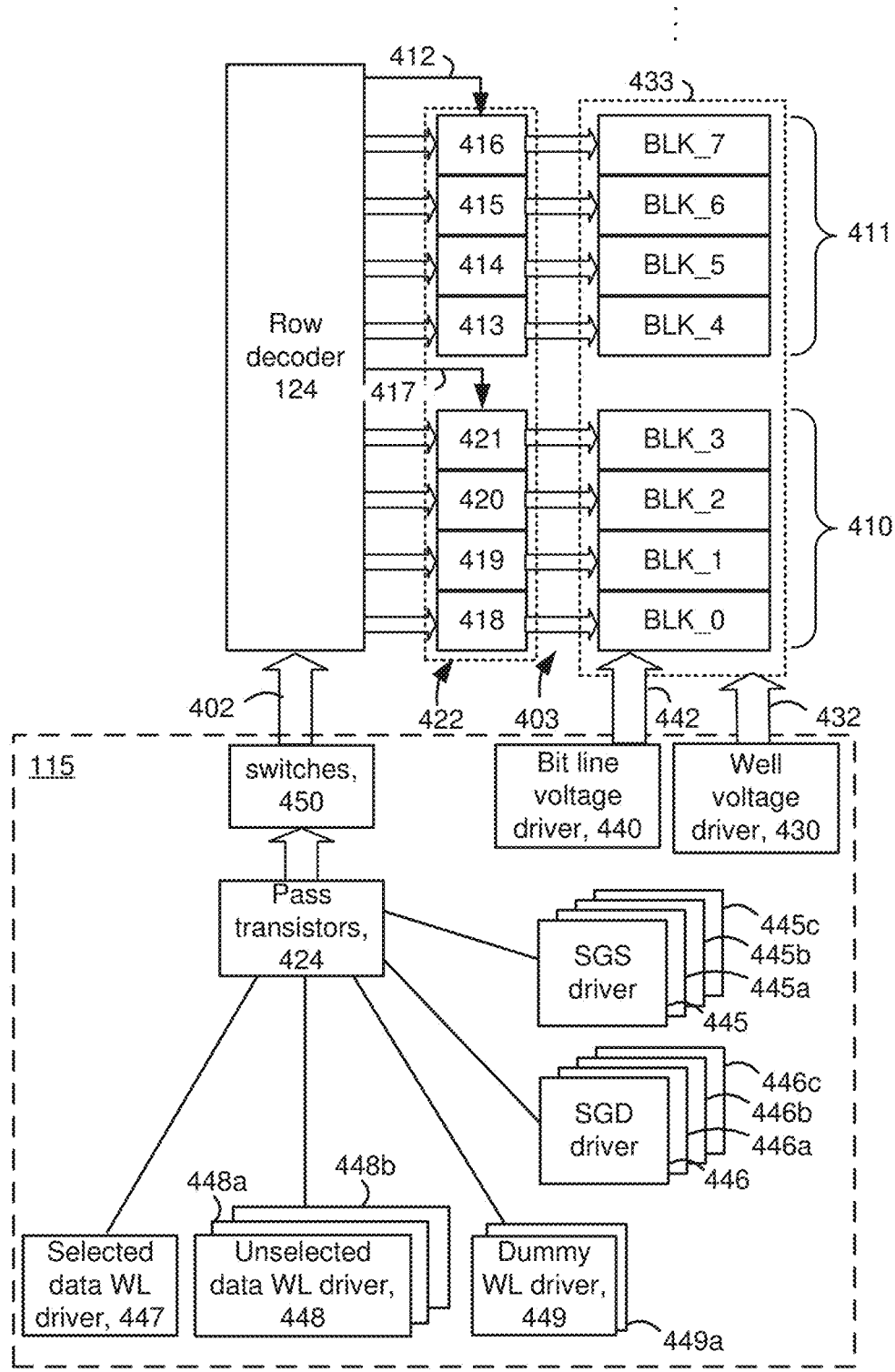
FIG. 3 depicts an example implementation of the power control module 115 of FIG. 1A for providing voltages to blocks of memory cells.

FIG. 3 depicts an example implementation of the power control module 115 of FIG. 1A for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1A provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

Figure 6A:
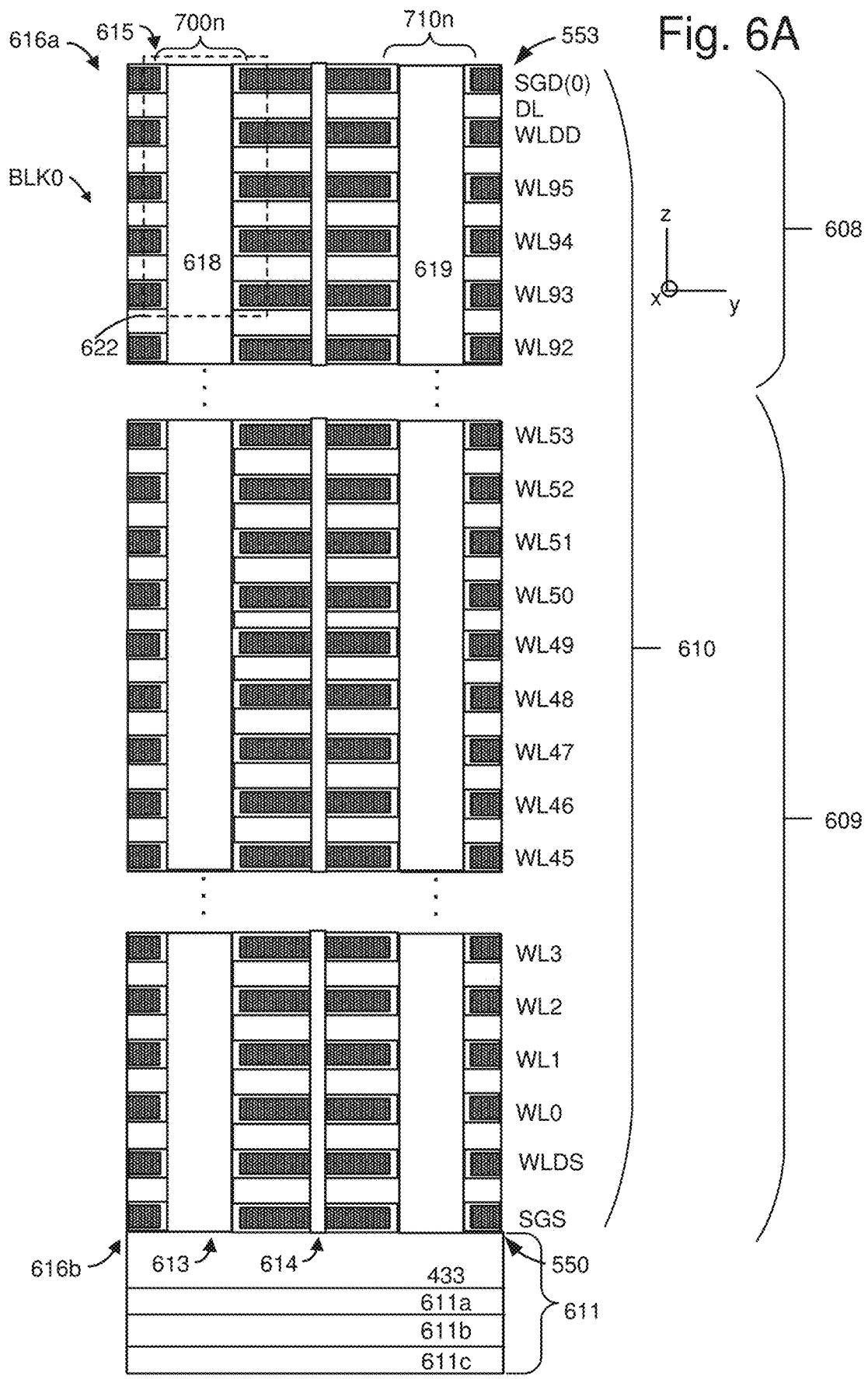
FIG. 6A depicts an example cross-sectional view of a portion of BLK0 of FIG. 4, including NAND strings 700n and 710n.

The voltage drivers can include a selected data word line (WL) driver 447, which provides a voltage on a data word line selected during a program or read operation, drivers 448, 448a and 448b for unselected data word lines, and dummy word line drivers 449 and 449a which provide voltages on dummy word lines WLDD and WLDS, respectively, in FIG. 6A. In one approach, the driver 448 is for WLn−1 the driver 448a is for WLn+1, and the driver 448b is for other, remaining unselected word lines. The drivers 448 and 448a can be used to independently control the pass voltages of WLn−1 and WLn+1 to minimize NWI, as discussed herein.

The voltage drivers can also include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIG. 7. In another option, one SGS driver is common to the different sub-blocks in a block.

The various components, including the row decoder, may receive commands from a controller such as the state machine 112 or the controller 122 to perform the functions described herein.

The well voltage driver 430 provides a voltage Vsl to the well region 611a in the substrate, via control lines 432. In one approach, the well region 433 is common to the blocks. A set of bit lines 442 is also shared by the blocks. A bit line voltage driver 440 provides voltages to the bit lines. In a stacked memory device such as depicted in FIGS. 4 to 7, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 4:
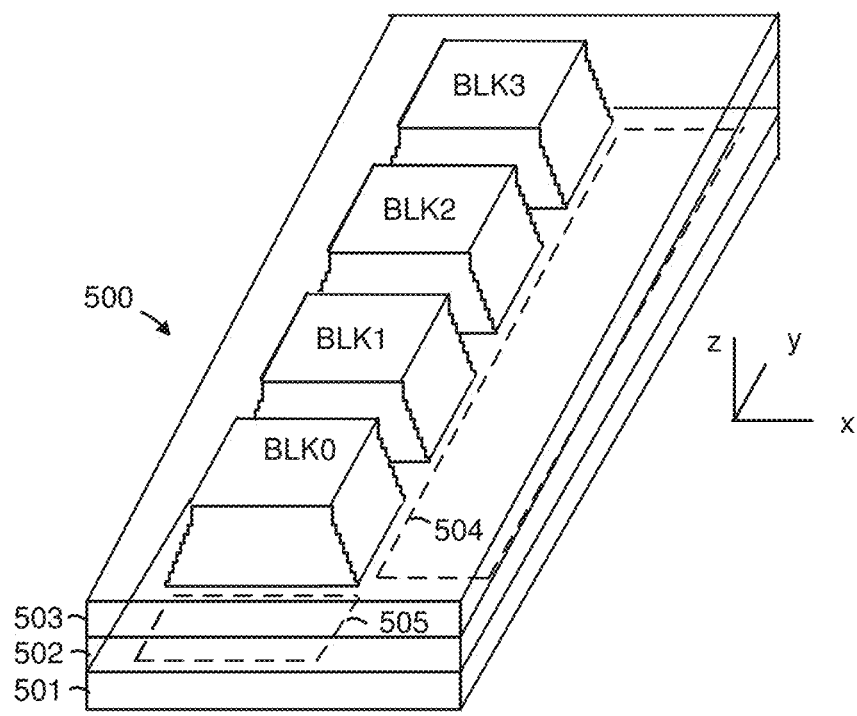
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
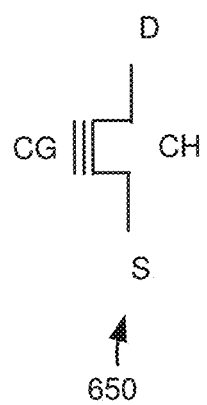
FIG. 5 depicts an example transistor 650.

FIG. 5 depicts an example transistor 650. The transistor comprises a control gate CG, a drain D, a source S and a channel CH and may represent a memory cell or a select gate transistor, for example.

FIG. 6A depicts an example cross-sectional view of a portion of BLK0 of FIG. 4, including NAND strings 700n and 710n. The block comprises a stack 610 of alternating conductive layers (word line layers) and dielectric layers. The layers may be rectangular plates having a height in the z direction, a width in the y direction, and a length in the x direction. The stack includes word lines in a top portion 608 and word lines in a bottom portion 609 or below the top portion. As discussed further below, the voltages of the adjacent word lines of WLn can be adjusted based on whether WLn is in the top portion of the stack.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). WLDS and WLDD are dummy word lines or conductive layers connected to dummy memory cells, which are ineligible to store user data. WL0-WL95 are data word lines connected to data memory cells, which are eligible to store user data. As an example only, the stack includes ninety-six data word lines. DL is an example dielectric layer.

A top 553 and bottom 550 of the stack are depicted. WL95 is the topmost data word line or conductive layer and WL0 is the bottommost data word line or conductive layer.

The NAND strings each comprise a memory hole 618 or 619, respectively, which is filled with materials which form memory cells adjacent to the word lines. For example, see region 622 of the stack which is shown in greater detail in FIG. 6B.

The stack is formed on a substrate 611. In one approach, a well region 433 (see also FIG. 3) is an n-type source diffusion layer or well in the substrate. The well region is in contact with a source end of each string of memory cells in a block. The n-type well region 433 in turn is formed in a p-type well region 611a, which in turn is formed in an n-type well region 611b, which in turn is formed in a p-type semiconductor substrate 611c, in one possible implementation. The n-type source diffusion layer may be shared by all of the blocks in a plane, in one approach, and form a source line SL which provides a voltage to a source end of each NAND string.

The NAND string 700n has a source end 613 at a bottom 616b of the stack 610 and a drain end 615 at a top 616a of the stack. Metal-filled slits may be provided periodically across the stack as interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

An insulation-filled region 614 separates the block into sub-blocks, where the NAND strings 700n and 710n are in different sub-blocks.

FIG. 6B depicts a close-up view of the region 622 of the stack of FIG. 6A. Memory cells are formed at the different levels of the stack at the intersection of a word line layer and a memory hole. An SGD transistor 718 connected to SGD (0), a dummy memory cell 715 connected to WLDD and data memory cells 712-714 connected to WL93-WL95, respectively, are depicted.

A number of layers can be deposited along the sidewall (SW) of the memory hole 629 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si$_3$N$_4$) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively, from the source end to the drain end of each NAND string.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. See FIG. 6C-6F. During an erase operation, the electrons return to the channel.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

FIG. 6C depicts portions 712p-714p of the memory cells 712-714, respectively, of FIG. 6B and electrons in the channels when the memory cells 712-714 are programmed to the Er, A and Er states, respectively. As mentioned, during programming, electrons are drawn into the charge-trapping layer 664.

For example, when the memory cell 713 of WL94 is programmed by a program pulse, electrons 630 are drawn into an associated portion of the charge-trapping layer. The program pulse applied to WL94 causes a direct electric field in the y-direction between the word line and the channel, and fringing electric fields which have components in the +z direction, to the drain side of WL94, and in the −z direction, to the source side of WL94. Due to the fringing fields, electrons 630d are drawn into a portion of the charge-trapping layer 664 between WL94 and WL95, and electrons 630s are drawn into a portion of the charge-trapping layer 664 between WL93 and WL94. The electrons drawn in by the fringing fields contribute to the Vth of the memory cell 713 when it is subject to a verify test. At this time, the memory cells on the drain side of WL94 have not yet been programmed Note that the electrons 630s and 630d also increase the effective channel length of the memory cell 713 from L1, which is the height of the word line layer, to L2. If the memory cell 713 was programmed to a higher data state than the A state as depicted, there would be more electrons drawn into the channel by the fringing field and therefore a channel length which is longer than L2.

When the memory cell 713 is subsequently read in a read operation, a read pass voltage such as 10 V is applied to the unselected word lines including WL93 and WL95 and this is sufficient to provide the associated regions of the charge-trapping layer in a strongly conductive state so that they do not interference with the sensing of the Vth of the memory cell 713.

Figure 6E:
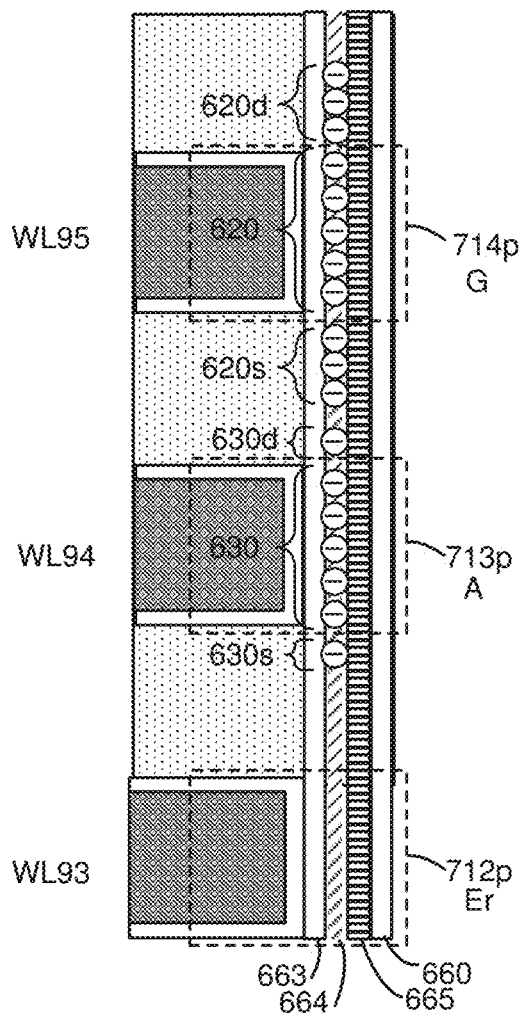
FIG. 6E depicts portions of the memory cells 712-714 of FIG. 6B and electrons in the channels when the memory cells 712-714 are programmed to the Er, A and G states, respectively.
Figure 6F:
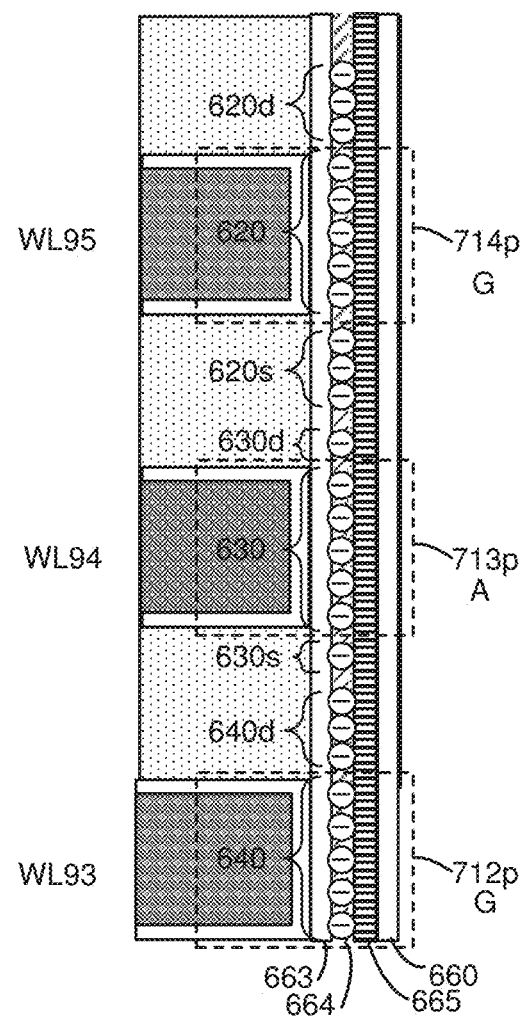
FIG. 6F depicts portions of the memory cells 712-714 of FIG. 6B and electrons in the channels when the memory cells 712-714 are programmed to the G, A and G states, respectively.

However, in the example of FIG. 6F, the regions of the charge-trapping layer comprising electrons 620s and 620d drawn in by a fringing field are not in a strongly conductive state. These electrons were not present when the memory cell 713 was programmed and act as parasitic cells which cause the Vth of the memory cell 713 to be higher when it is read compared to when it was programmed. This is an example of neighbor word line interference (NWI). NWI is expected to become worse as memory devices as scaled down and the space between word lines decreases.

With NWI, a selected memory cell connected to a selected word line WLn (e.g., the memory cell 713 connected to WL94) can be disturbed when the adjacent memory cell (e.g., the memory cell 714) connected to the adjacent word line (e.g., WL95) is programmed Both memory cells are in the same NAND string 700n. The disturb is strongest when the memory cell 713 is in a low programmed data state (e.g., the E state) and the WLn+1 memory cell 714 is in a high programmed data state (e.g., the G state). As mentioned, when the memory cell 714 is programmed, parasitic charges are created in the charge trapping layer, causing the Vth of the memory cell 713 to appear to be upshifted. The disturb is greater when the amount by which the threshold voltage (Vth) or data state of the memory cell 714 exceeds the Vth or data state, respectively, of the memory cell 713, is greater.

In this example of FIG. 6C, the memory cell 713 is programmed to the A state, the lowest programmed state, and the adjacent memory cells 712 and 714 are in the erased state. The amount of NWI is therefore relatively small and this is denoted by the presence of one representative electron in the electrons 620s and 620d. See FIG. 10A-11 for further details regarding different data patterns in NAND string.

NWI can result in read errors and reduce the Vth margin, which is the separation between the Vth distributions of the different data states. A higher Vth margin is preferable. While it is possible to reduce NWI through techniques such as programming in multiple passes, this increases programming time.

Another problem involves read disturb. When a read pass voltage such as 10 V is applied to the unselected word lines during the reading of memory cells of a selected word line, there is a risk of weakly programming the associated memory cells. Read disturb is also expected to become worse as memory devices as scaled down and the diameter of the memory holes decreases. With a smaller memory hole diameter, the electric field cause by a given read pass voltage is greater and therefore more likely to result in read disturb. Read disturb can also increase NWI.

Various solutions to NWI are discussed further below.

FIG. 6D depicts portions of the memory cells 712-714 of FIG. 6B and electrons in the channels when the memory cells 712-714 are programmed to the G, A and Er states, respectively. Since the memory cell 712 is programmed to the G state, the highest programmed state in FIG. 8, the number of electrons 640*d* drawn in by the fringing field is relatively high. However, since these electrons are present at the time the memory cell 713 is programmed, they should not increase the Vth of the memory cell 713 when it is read as long as the voltage on WL93 during the read operation is not lower than during the verify tests. The source side electrons of the memory cell 712 are not depicted.

FIG. 6E depicts portions of the memory cells 712-714 of FIG. 6B and electrons in the channels when the memory cells 712-714 are programmed to the Er, A and G states, respectively. Since the memory cell 714 is programmed to the G state, the number of electrons 620*s* and 620*d* drawn in by the fringing fields is relatively high. Moreover, since these electrons are not present at the time the memory cell 713 is programmed, they cause NWI and increase the sensed Vth of the memory cell 713 when it is read compared to when it was programmed.

FIG. 6F depicts portions of the memory cells 712-714 of FIG. 6B and electrons in the channels when the memory cells 712-714 are programmed to the G, A and G states, respectively. Since the memory cell 712 is programmed to the G state, the number of electrons 640*d* drawn in by the fringing field is relatively high. However, since these electrons are present at the time the memory cell 713 is programmed, they should not increase the Vth of the memory cell 713 when it is read as long as the voltage on WL93 during the read operation is not lower than during the verify tests.

Since the memory cell 714 is also programmed to the G state, the number of electrons 620*s* and 620*d* drawn in by the fringing fields is relatively high. These electrons cause NWI and increase the sensed Vth of the memory cell 713, as mentioned.

Figure 7:
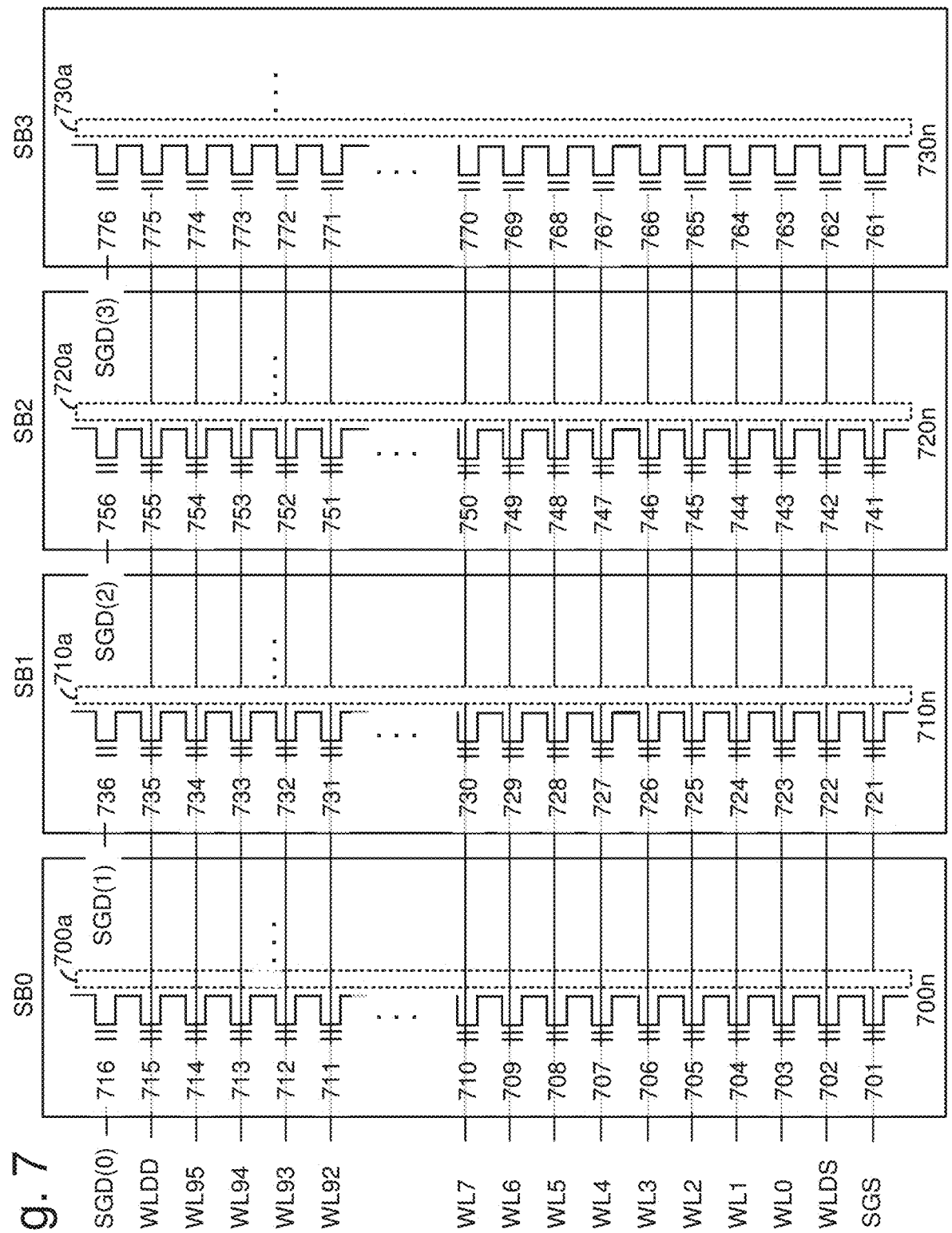
FIG. 7 depicts an example view of NAND strings in a block BLK0 which is consistent with FIGS. 4 and 6A.

FIG. 7 depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700*n*, 710*n*, 720*n* and 730*n*, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700*n*, 710*n*, 720*n* and 730*n* are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. Another option programs all of the memory cells in one sub-block, one word line at a time, before programming the memory cells of the next sub-block. For example, this can involve programming WL0, then WL1 and so forth in SB0, followed by programming WL0, then WL1 and so forth in SB1, and so forth. The word line programming order may start at WL0, the source-end word line and end at WL95, the drain-end word line, for example.

The NAND strings 700*n*, 710*n*, 720*n* and 730*n* have channels 700*a*, 710*a*, 720*a* and 730*a*, respectively.

Additionally, NAND string 700*n* includes SGS transistor 701, dummy memory cell 702, data memory cells 703-714, dummy memory cell 715 and SGD transistor 716. NAND string 710*n* includes SGS transistor 721, dummy memory cell 722, data memory cells 723-734, dummy memory cell 735 and SGD transistor 736. NAND string 720*n* includes SGS transistor 741, dummy memory cell 742, data memory cells 743-754, dummy memory cell 755 and SGD transistor 756. NAND string 730*n* includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

FIG. 8 depicts example Vth distributions of a set of memory cells with and without program disturb. The vertical axis depicts a number of memory cells on a logarithmic scale, and the horizontal axis depicts a Vth of the memory cells on a linear scale. In one approach, at a start of a program operation, the memory cells are all initially in the erased (Er) state, as represented by the Vth distribution 800. After the program operation is successfully completed, the memory cells assigned to the A-G states are represented by the Vth distributions 801-807.

The memory cells which are programmed to the A-G states using verify voltages of VvA–VvG, respectively, are represented by the Vth distributions 801-807, respectively. These Vth distributions are obtained just after completion of the program operation, and assume no program disturb has occurred. The verify voltages are used in the program-verify tests of the memory cells. Read voltages VrA–VrG can be used for reading the states of the memory cells in a read operation. These verify voltages and read voltages are examples of control gate read levels of the selected word line voltage.

However, due to program disturb, the Vth of the data memory cells can shift higher, as represented by the Vth distributions 810, 811, 812 and 813 for the Er, A, B and C data states, respectively. The amount of program disturb (amount of Vth upshift at the upper tail of the Vth distribution) is relatively larger for the relatively lower data states. The relatively high data states of D-G in this example are assumed to have no program disturb, as a simplification. The techniques described herein for reducing program disturb and, in particular, NWI, can reduce the amount of Vth upshift.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied to the word lines.

The Er-G states are examples of assigned data states, and the A-G states are examples of programmed data states, in this eight state example. The number of data states could be higher or low than eight data states.

FIG. 9A depicts an example voltage signal in a program operation. The voltage signal can be used in a single pass program operation or in one pass of a multi-pass program operation. The program operation can be used to program memory cells to threshold voltages such as depicted in FIG. 8. The horizontal axis denotes a program loop (PL) number, ranging from 1-18, and the vertical axis denotes voltage. During a program operation, program loops are performed for a selected word line in a selected sub-block. A program loop comprises a program portion in which a program voltage or pulse is applied to the selected word line followed by a verify portion in which a verify signal or pulse is applied to the selected word line while one or more verify tests, referred to as program-verify tests, are performed for the associated memory cells. Other than the erased state, each assigned state has a verify voltage which is used in the verify test for the state in a program operation.

The voltage signal 900 includes a series of program voltages, including an initial program voltage 901, which are applied to a word line selected for programming In this example, the voltage signal includes program voltages which increase stepwise in amplitude in one or more program loops of a programming pass using a fixed or varying step size. This is referred to as incremental step pulse programming, where the program voltage (Vpgm) starts at an initial voltage, Vpgm_init, and increases in a step in each successive program loop, for instance, until the program operation is completed. A fixed step size of dVpgm is depicted. A successful completion occurs when the threshold voltages of the selected memory cells reach the verify voltages of the assigned data states. A program operation can include a single programming pass or multiple programming passes, where each pass uses incremental step pulse programming, for instance.

The verify signal in each program loop, including example verify signal 902, can include one or more verify voltages, based on the assigned data states which are being verified for the program loop. The verify tests can encompass lower assigned data states and then midrange assigned data states and then higher assigned data states as the program operation proceeds, such as depicted in FIG. 9B. The example verify signals depict three verify voltages as a simplification.

All memory cells may initially be in the erased state at the beginning of the program operation, for instance. After the program operation is completed, a Vth distribution similar to that in FIG. 8A is achieved, and the data can be read from the memory cells using read voltages which are between the Vth distributions. At the same time, a read pass voltage, Vpass (e.g., 8-10 V), also referred to as a turn on voltage, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the Er, A, B, C, D, E, F and G states is 111, 110, 100, 000, 010, 011, 001 and 101, respectively. In each three-bit sequence, the UP bit is followed by the MP bit and then the LP bit. The data of the lower, middle and upper pages can be determined by reading the memory cells using read voltages of VrA and VrE; VrB, VrD and VrF; and VrC and VrG, respectively.

FIG. 9B depicts an example of verify voltages used in different program loops of FIG. 9A. The horizontal bars are time-aligned with the program loop axis of FIG. 9A. The set of verify voltages 910 includes VvA, VvB, VvC, VvD, VvE, VvF and VvG used in program loops 1-7, 2-9, 4-10, 5-12, 7-14, 8-16 and 10-18, respectively.

FIG. 10A depicts example Vth distributions of a set of memory cells of WLn, showing the effects of symmetric and asymmetric voltages on WLn−1 and WLn+1 during a read operation, where programming is performed using symmetric verify pass voltages. In FIGS. 10A and 10B, the vertical axes depicts a number of memory cells of one data state and the horizontal axes depicts Vth. The horizontal axes are aligned. Generally. NWI can be reduced by adjusting the read pass voltages, verify pass voltages and/or program pass voltages, where the adjustment is data state-dependent.

A read pass voltage may be defined as the voltage applied to unselected word lines during a read operation of a selected word line, where the read operation involves determining the data state to which a memory cell has previously been programmed A read operation distinguishes between adjacent data states (between their Vth distributions) which can include distinguishing between the erased state and a lowest programmed data state, e.g., using a control gate read voltage of Vcgr=VrA, and distinguishing between two programmed data states, e.g., using Vcgr=VrB–VrG. A verify pass voltage may be defined as the voltage applied to unselected word lines during a verify test of a selected word line which occurs in a program operation. A program pass voltage may be defined as the voltage applied to unselected word lines when a program pulse is applied to a selected word line in a program operation.

In some implementations, asymmetric read pass voltages are used where the read pass voltage applied to WLn−1 is less than the read pass voltage applied to WLn+1 by at least a delta or difference such as 0.5-1 V. In contrast, with symmetric read pass voltages, the WLn−1 pass voltage is equal to or roughly equal to the WLn+1 read pass voltage, e.g., the WLn−1 read pass voltage is not less than the WLn+1 read pass voltage by at least the delta. That is, a difference between the WLn−1 read pass voltage and the WLn+1 read pass voltage is less than the delta.

In some implementations, the read pass voltages of WLn−1 and WLn+1 are asymmetric or symmetric according to the data states being read, and the verify pass voltages of WLn−1 and WLn+1 are asymmetric or symmetric according to the data states being verified.

In an example implementation of a program disturb countermeasure, the verify and read pass voltages of WLn−1 and WLn+1 are symmetric for a verify or read operation involving a lowest programmed data state and asymmetric at other times, for a verify or read operation not involving the lowest programmed data state. During the asymmetry, the voltage of WLn−1 can be adjusted lower than the normal level which is applied to WLn+1 and the remaining unselected word lines.

In particular, to suppress the upshift in the upper tail of the Er state memory cells, the symmetric implementation can be used during the verify tests of the A state memory cells, when VvA is applied to WLn, but not during the verify tests of the higher state memory cells (e.g., B-G in the example of FIG. 8), when VvB-VvG is applied to WLn. The symmetric implementation can similarly be used during the read operation which distinguishes between the Er state cells and the A state cells, e.g., when VrA is applied to WLn, but not during the read operations which distinguish between higher programmed states, e.g., when VrB–VrG are applied to WLn. This data state-dependent implementation increases Vth margin and is advantageous relative to a data state-independent implementation.

The decision to use the NWI countermeasure can also be based on a position of WLn in a stack, in a word line-dependent approach, or other factors which indicate a likelihood of program disturb such as temperature or number of program-erase cycles. For example, the asymmetric read pass voltages can be used for high word lines, closer to the drain ends of the NAND strings and to the top of the stack, e.g., in the top portion 608 of FIG. 6A, while symmetric read pass voltages can be used for the remaining word lines e.g., in the bottom portion 609 of FIG. 6A. This is done since there is less channel boosting for the higher word lines so that the risk of program disturb is greater.

The techniques described herein advantageously do not incur a performance penalty by increasing the read or program time.

To understand how the NWI countermeasure can improve the Vth margin, consider an example in which the programming uses symmetric verify pass voltages and the reading uses symmetric or asymmetric read pass voltages. In FIG. 10A, the Vth distribution 1000 is for memory cells of WLn after they have been programmed using symmetric verify pass voltages, and read using symmetric read pass voltages, and before WLn+1 has been programmed. The programming is to the A state using the verify voltage VvA, as an example. The Vth distributions 1001 and 1002 represent the memory cells of WLn after the memory cells of WLn+1 have been programmed (pgm), and the Vth is read using symmetric (sym) or asymmetric (asym) read pass voltages, respectively.

After the memory cells of WLn+1 are programmed, the Vth distribution width for WLn increases and is upshifted due to NWI. Moreover, the lower tail of the Vth distribution 1001 increases by a relatively small amount as indicated by an arrow 1003 and the upper tail of the Vth distribution increases by a relatively large amount as indicated by an arrow 1004. The A state memory cells can be classified to include those which experience a relatively small or large amount of NWI and therefore have their Vth upshifted by a relatively small or large amount, respectively, since there are relatively few or many electrons, respectively, injected into the parasitic cells between WLn and WLn+1.

The extra charges in the parasitic cells shift up the Vth and also increase the effective channel length of the WLn memory cells, as depicted by the channel length L2 in FIG. 6C.

The Vth distribution 1002 is obtained by reading WLn with asymmetric read pass voltages, where the read pass voltage on WLn-1 is lower than on WLn+1. When the read pass voltage is lowered on WLn-1, the sensed Vth of the WLn memory cells is higher because the electrons associated with WLn-1 are less strongly conductive. Moreover, comparing the Vth distributions 1001 and 1002, the increase in the lower tail of the Vth distribution 1001 (arrow 1005) is greater than the increase in the upper tail (arrow 1006). Accordingly, the asymmetric read pass voltages have an opposite effect to the effect of the NWI. Lowering the read pass voltage on WLn-1 therefore provides compensation for NWI. The read pass voltage on WLn-1 can be considered to modulate the Vth on the WLn memory cells. Moreover, this modulation is relatively stronger for the memory cells with a relatively low Vth and fewer parasitic charges (in the lower tail of the Vth distribution 1000) compared to memory cells with a relatively high Vth and many parasitic charges (in the upper tail of the Vth distribution 1000). The memory cells with many parasitic charges also have a longer channel length. These memory cells are therefore less sensitive to a change in the read pass voltage on WLn-1 and to a corresponding change in the fringing field.

However, for Er state memory cells which are most susceptible to an upshift in Vth due to program disturb (see Vth distribution 810 in FIG. 8) but are not subject to a verify test during programming, lowering the read pass voltage of WLn-1 is undesirable. Instead, using symmetric verify and read pass voltages for the VrA read avoids this upshift.

FIG. 10B depicts example Vth distributions of a set of memory cells of WLn, showing the effects of symmetric and asymmetric voltages on WLn-1 and WLn+1 during a read operation, where programming is performed using asymmetric verify pass voltages. The Vth distribution 1010 represents memory cells of WLn after they have been programmed and before WLn+1 has been programmed, when the Vth is read using symmetric read pass voltages. The Vth distribution 1011 is for the memory cells of WLn before WLn+1 has been programmed when the Vth is read using asymmetric read pass voltages. The Vth distribution 1012 represents the memory cells of WLn after WLn+1 has been programmed when the Vth is read using asymmetric read pass voltages. The Vth distribution 1011 is the same as the Vth distribution 1000 in FIG. 10A, and the Vth widening from 1011 to 1012 is the same as the widening from the Vth distributions 1000 to 1002 in FIG. 10A.

While FIG. 10A provides a more intuitive explanation for the NWI improvement, FIG. 10B is closer to the real application as the read Vpass settings are consistent between verify and read.

FIG. 11 depicts a plot of Vth width versus VWLn-1_read pass for memory cells of WLn for different combinations of data states of memory cells of WLn-1 and WLn+1 within a NAND string. The width of the Vth distribution of the memory cells of WLn depends on the data states of the adjacent memory cells of WLn-1 and WLn+1, for each NAND string. These examples assume the memory cells are in the lowest state (the Er state) or the highest state (the G state). The plot 1100 is for the case where the memory cells of WLn-1 and WLn+1 are in the Er and G states, respectively. The plot 1101 is for the case where the memory cells of WLn-1 and WLn+1 are both in the G state. The plot 1102 is for the case where the memory cells of WLn-1 and WLn+1 are both in the Er state. The plot 1103 is for the case where the memory cells of WLn-1 and WLn+1 are in the G and Er states, respectively.

Plot 1102 shows that the Vth width is essentially constant even as VWLn-1_read pass changes. In this case, there are no extra electrons which form parasitic cells on either side of WLn.

Plot 1103 shows that the Vth width is approximately constant until VWLn-1_read pass falls below a certain level, at which point the Vth width increases sharply. With the G state memory cell of WLn-1, there will be parasitic charges between WLn-1 and WLn. As a result, when VWLn-1_read pass decreases, the Vcgr on WLn has to be higher to provide the WLn memory cell in a non-conductive state. This results in the sensed Vth of the memory cell of WLn-1 being higher and widening the Vth distribution.

The plot 1100 shows a worse case for NWI, since the Vth width is the highest among the four cases. In this case, there is significant NWI for the WLn memory cell since it is in the lowest state and the later-programmed WLn+1 memory cell is in the highest state. The Vth width is therefore higher than for the other cases. Moreover, the Vth width decreases as VWLn-1_read pass decreases. In particular, the memory cells with relatively more parasitic charges between WLn and WLn+1 have a relatively larger Vth upshift. As VWLn- 1_read pass decreases, there is a change in the fringing field of the WLn−1 memory cells, and this change is more impactful for the memory cells of WLn which have experienced less NWI and have a lower Vth and shorter channel length. As a result, the lower tail of the Vth distribution of the WLn memory cells will shift up more than the upper tail of the Vth distribution, resulting in a narrower Vth width.

The result of plot 1101 represents a combination of the effects described in connection with plots 1100 and 1103. With a small decrease in VWLn−1_read pass, the fringe field effect dominates, and the Vth width decreases. However, as VWLn−1_read pass decreases further, the parasitic charge effect dominates, which increases the Vth width.

If the memory cell of WLn is in the G state, the effective channel length is relatively long, making it immune to the above effects. However, when NWI is relatively strong, e.g., due to a relatively small word line spacing, the use of symmetric program pass voltages, WLn being close to the top portion of the stack, or a relatively high bit line voltage during sensing, the NWI countermeasures described herein are especially advantageous.

FIG. 12 depicts plots of a sum of Vth widths for states A-F versus VWLn−1_read pass for different word line spacings. A smaller sum is more advantageous. Generally, by reducing VWLn−1_read pass (along with VWLn−1_verify pass), the sum can be decreased. Moreover, this benefit is greater when the word line spacing is decreased or other factors increase the likelihood of program disturb. The word line spacing is lowest, second lowest, third lowest and fourth lowest (or highest) for plots 1200, 1210, 1220 and 1230, respectively.

In a Case 1, the plots 1201, 1211, 1221 and 1231 represent the Vth width obtained by programming using symmetric program pass voltages and reading using different levels of VWLn−1_read pass, where a relatively high bit line voltage such as 0.5 V is used during the reading. In a Case 2, the plots 1202, 1212, 1222 and 1231 represent the Vth width obtained by programming using symmetric program pass voltages and reading using different levels of VWLn−1_read pass, where a relatively low bit line voltage such as 0.25 V is used during the reading. The sum of the widths is decreased by using a lower bit line voltage. Lowering the bit line voltage reduces NWI. However, it cannot be lowered too much because the NAND string current should not be too low during sensing. The optimum bit line voltage can be chosen based on factors such as the number of word line layers, the height of the stack, the quality of the channel layer, and the noise level of sense circuits.

In a Case 3, the plots 1203, 1213, 1223 and 1231 represent the Vth width obtained by programming using asymmetric program pass voltages and reading using different levels of VWLn−1_read pass, where the relatively low bit line voltage is used during the reading. The sum of the widths is decreased further by using asymmetric program pass voltages.

In each case, the Vth width increases as the WL spacing decreases. Also, the Vth width decreases as VWLn−1_read pass decreases, indicating the effectiveness of the techniques described herein.

The plot 1231 indicates the Vth width does not vary significantly based on the bit line voltage or whether asymmetric program pass voltages are used.

Figure 13:
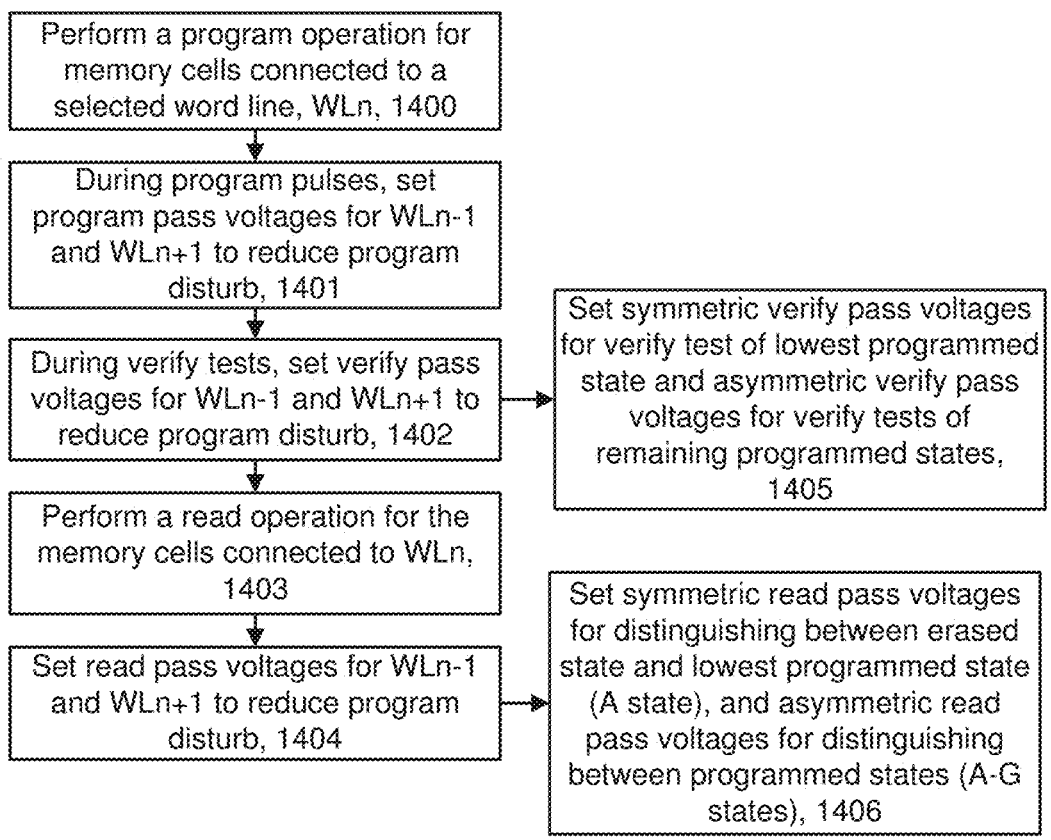
FIG. 13 depicts an example process for performing a program operation and a read operation for WLn while setting pass voltages for WLn−1 and WLn+1 to reduce program disturb.

FIG. 13 depicts an example process for performing a program operation and a read operation for WLn while setting pass voltages for WLn−1 and WLn+1 to reduce program disturb. Step 1400 includes performing a program operation for memory cells connected to a selected word line. This step includes step 1401 which includes, during program pulses, setting program pass voltages for WLn−1 and WLn+1 to reduce program disturb. One example is setting asymmetric program pass voltages, where VWLn−1_program pass<VWLn+1_program pass.

Step 1402 includes, during verify tests, setting verify pass voltages for WLn−1 and WLn+1 to reduce program disturb. One example is setting symmetric verify pass voltages, where VWLn−1_verify pass=VWLn+1_verify pass, for the verify test of the lowest programmed state, and setting asymmetric verify pass voltages, where VWLn−1_verify pass<VWLn+1_verify pass for the verify tests of the remaining programmed states (step 1405).

Step 1403 includes performing a read operation for the memory cells connected to WLn. This step can include step 1404, which includes setting read pass voltages for WLn−1 and WLn+1 to reduce program disturb. One example is setting symmetric read pass voltages, where VWLn−1_read pass=VWLn+1_read pass for distinguishing between the erased state and the lowest programmed state (e.g., A state) (step 1406), and setting asymmetric read pass voltages, where VWLn−1_read pass<VWLn+1_read pass for distinguishing between the programmed states (e.g., A-G states) (step 1406).

Figure 14A:
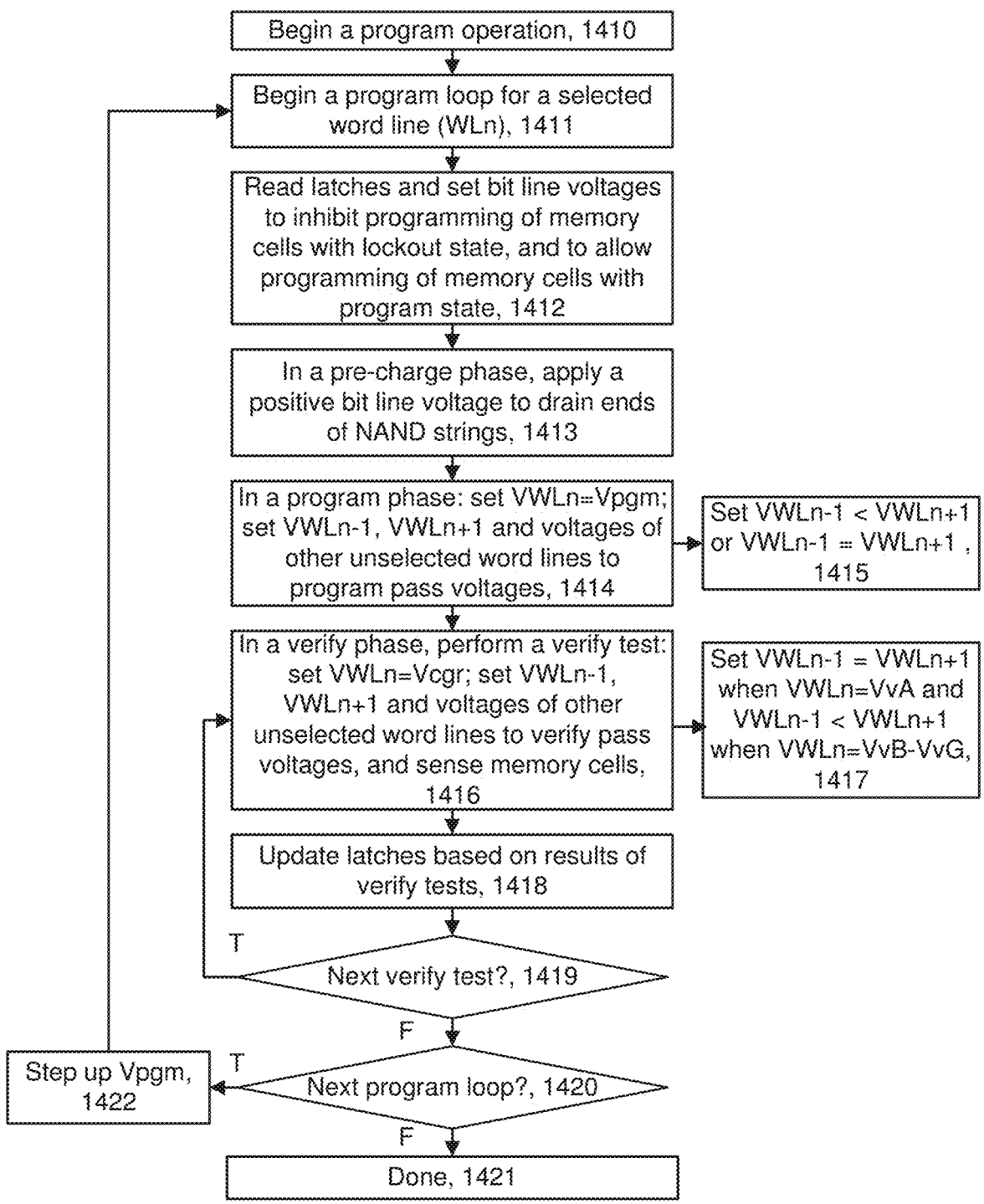
FIG. 14A depicts an example program operation consistent with the process of FIG. 13.

FIG. 14A depicts an example program operation consistent with the process of FIG. 13. A program operation begins at step 1410, and can include multiple program loops in one or more passes, such as depicted in FIG. 9A. At step 1411, a program loop begins for a selected word line (WLn). Step 1412 includes reading the latches of the selected memory cells, e.g., to determine whether the memory cells are in a lockout or program state. The step also includes setting bit line voltages to inhibit programming of memory cells with the lockout state, e.g., by setting Vbl=2 V, and to allow programming of memory cells with the program state, e.g., by setting Vbl=0 V. Step 1413 includes performing a precharge phase by applying a positive bit line voltage to the drain ends of the NAND strings. See FIG. 16D.

Figure 16A:
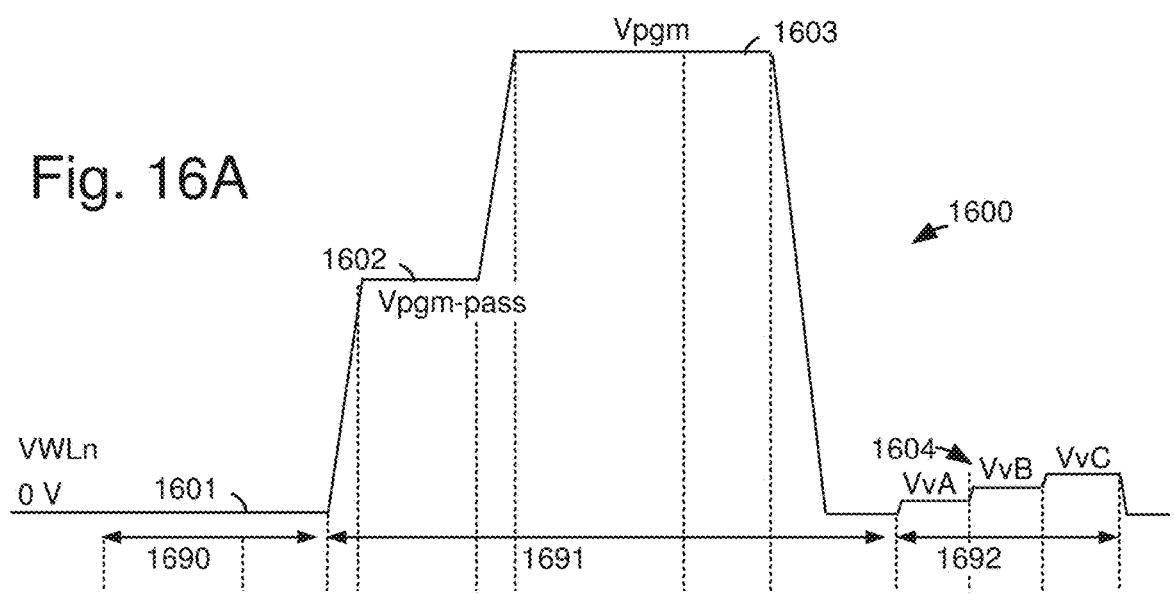
FIG. 16A-16D depicts examples of voltage signals which can be used in a program loop of a program operation, consistent with FIGS. 13 and 14A.
Figure 16B:
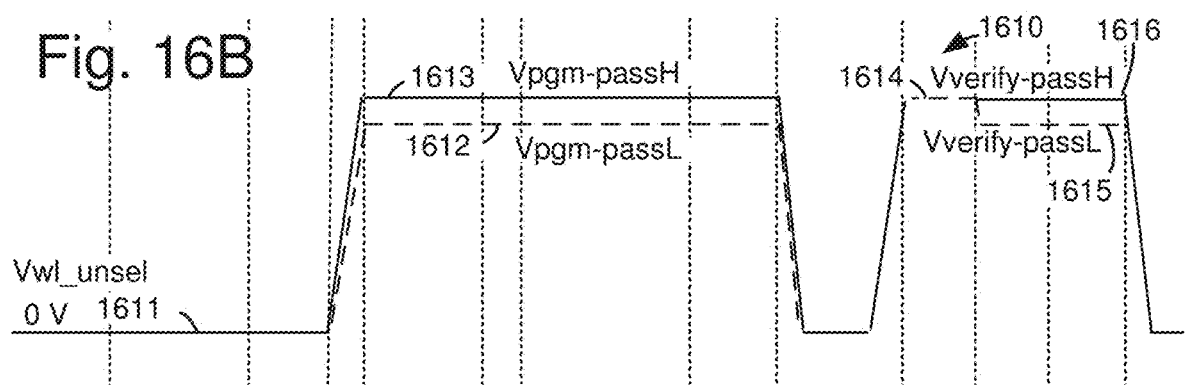

Step 1414 includes, in a program phase, setting VWLn=Vpgm (see FIG. 16A), and setting VWLn−1, VWLn+1 and voltages of other unselected word lines to program pass voltages (see FIG. 16B). Step 1414 can include step 1415 which sets VWLn−1<VWLn+1 or VWLn−1=VWLn+1.

Step 1416 includes, in a verify phase, performing verify tests for selected memory cells connected to WLn. This includes setting VWLn=Vcgr, a control gate read voltage such as VrA-VrG, setting voltages of VWLn−1 and VWLn+1 and other unselected word lines to verify pass voltages (see FIG. 16B), and sensing the memory cells. Step 1416 includes step 1417, which sets VWLn−1=VWLn+1 when VWLn=VvA and VWLn−1<VWLn+1 when VWLn=VvB-VvG.

Step 1418 includes updating the latches based on the results of the verify tests. For example, the latches can be updated from the program state to the lockout state for memory cells which pass a verify test at step 1416. A decision step 1419 determines if there is a next verify test. For example, specific verify tests can be performed at specific program loops as depicted in FIG. 9B. If the decision step 1419 is true, a next verify test is performed at step 1416. If the decision step 1419 is false, a decision step 1420 determines if there is a next program loop. A next program loop may be performed if many memory cells have not completed programming or are otherwise not in the lockout state. If this is true, step 1422 includes stepping up Vpgm, and a next program loop begins at step 1411. If decision step 1420 is false, step 1421 denotes the end of the program operation. The program operation may be ended when all, or nearly all of the memory cells connected to WLn are in the lockout state.

FIG. 14B depicts an example read operation consistent with the process of FIG. 13. The read operation begins at step 1430. Generally, a read operation can involve reading one or more pages of data. Step 1431 includes beginning to read a page of data from a selected word line. Step 1432 includes applying a control gate read voltage (see FIG. 17A), VWLn to WLn, and setting VWLn−1, VWLn+1 and voltages of other unselected word lines to read pass voltages (see FIG. 17B). As part of step 1432, step 1433 can be used to set VWLn−1=VWLn+1 when VWLn=VrA and VWLn−1<VWLn+1 when VWLn=VrB−VrG, in one approach.

Step 1434 updates the latches based on the results of the sensing, e.g., based on whether the memory cells are in a conductive or on-conductive state. A decision step 1435 determines if there is a next VWLn to apply to WLn in reading the current page. If the decision step 1435 is true, a next read or sensing is performed at step 1432. If the decision step 1435 is false, a decision step 1436 determines if there is a next page to read. If this is true, step 1431 is reached. If decision step 1436 is false, step 1437 denotes the end of the read operation.

FIG. 15A depicts an example of a likelihood of program disturb as a function of temperature. The program disturb countermeasures described herein can be used when the likelihood of program disturb is relatively high and not used when the likelihood of program disturb is relatively low, in one approach. In another option, the program disturb countermeasures can be phased in as the likelihood of program disturb increases. For example, when the ambient temperature (Temp) of the memory device is below or above a threshold level, Temp1, e.g., 40 C, the likelihood of program disturb is relatively high or low, respectively. Accordingly, one approach is to use the countermeasures when the temperature is below Tempt, and not use the countermeasures when the temperature is above Temp1.

FIG. 15B depicts another example of a likelihood of program disturb as a function of temperature. In this example, the countermeasure is phased in as Temp decreases below a first threshold Temp1 but not below a second threshold Temp2<Temp1. There is a low, moderate or high likelihood of program disturb when Temp>Temp1, Temp1>Temp>Temp2, and Temp<Temp2, respectively. The phasing in can involve adjusting the amount (or delta) by which VWLn−1 is less than VWLn+1 when the asymmetric pass voltages are used. For example, the delta can be 0V, 0.5 V or 1 V when there is a low, moderate or high likelihood, respectively, of program disturb.

FIG. 15C depicts an example of a likelihood of program disturb as a function of the position of WLn in a stack. The likelihood of program disturb is greater when WLn is relatively close to the top of a stack and the drain ends of the NAND strings, due to factors such as reduced channel boosting. In one approach, the likelihood of program disturb is high when WLn is in a top portion of the stack and low when WLn is below the top portion. The top portion 608 (FIG. 6A) could include no more than 15-25% of the topmost word lines in the stack, for example. The word lines below the top portion (portion 609) could then include at least 75-85% of the word lines in the stack. The countermeasure can be implemented when WLn is in the top portion of the stack but not when it is below the top portion. For example, in FIG. 7, the 25% topmost word lines comprise WL71-WL95 and the bottom portion comprises WL0-WL70.

FIG. 15D depicts another example of a likelihood of program disturb as a function of the position of WLn in a stack. The stack can be divided into three (or more) portions which have different likelihoods of program disturb. In one approach, there is a high, moderate or low likelihood of program disturb when WLn is in a first, second or third portion, respectively, of the stack. The first portion include a set of topmost word lines in the stack, the second portion includes word line below those in the first portion, and the third portion includes those below the second portion. The countermeasure can be phased in similar to the discussion in connection with FIG. 15B.

FIG. 15E depicts an example of a likelihood of program disturb as a function of a number of program-erase cycles. Program disturb can increase as the number of P-E cycles increases for a block of memory cells. This is due to deterioration of the memory cells which makes them easier to program. Accordingly, one approach is to implement the program disturb countermeasures as a function of the number of P-E cycles. In one approach, when the number of P-E cycles is above a threshold, P-E cycles1, there is a high likelihood of program disturb so that the countermeasures are implemented. When the number of P-E cycles is below the threshold, there is a low likelihood of program disturb so that the countermeasures are not implemented.

FIG. 15F depicts another example of a likelihood of program disturb as a function of a number of program-erase cycles. In this example, the countermeasure is phased in as the number of P-E cycles increases above a threshold, P-E cycles2 but not above P-E cycles1. There is a low, moderate or high likelihood of program disturb when P-E cycles<P-E cycles2, P-E cycles2<P-E cycles<P-E cycles1, and P-E cycles>P-E cycles2, respectively. The countermeasure can be phased in similar to the discussion in connection with FIG. 15B.

FIG. 15G depicts an example of a low likelihood of program disturb when asymmetric Vpgm-pass is used. With asymmetric Vpgm-pass, VWLn−1_program pass<VWLn+1_program pass by at least a specified delta such as 0.5-1 V. The use of asymmetric Vpgm-pass is associated with a low likelihood of program disturb.

FIG. 15H depicts an example of a high likelihood of program disturb when symmetric Vpgm-pass is used. With symmetric Vpgm-pass, VWLn−1_program pass=VWLn+1_program pass or VWLn−1_program pass is not less than VWLn+1_program pass by at least a specified delta such as 0.5-1 V. The use of symmetric Vpgm-pass is associated with a high likelihood of program disturb. In some cases, Vpgm-pass changes from asymmetric to symmetric when WLn is relatively close to the top of the stack where reduced channel boosting can result in an increased likelihood of program disturb.

Regarding FIGS. 15G and 15H, as mentioned, asymmetric program pass voltages can used as an NWI countermeasure in many cases. However, it can degrade program disturb in some cases, such as when WLn is a relatively high word line in the stack. Accordingly, asymmetric program pass voltages should not be used in the cases where program disturb is already degraded. In this case, the NWI countermeasures proposed herein can be used as they improve NWI without degrading program disturb.

FIG. 15I depicts an example plot showing a delta=VWLn+1-VWLn−1 as a function of a likelihood of program disturb. The delta can be greater when the likelihood of program disturb is greater. For example, the delta can be greater when the temperature is below a threshold than when the temperature is above the threshold. The delta can be larger when the selected word line is in a top portion of the stack comprising no more than 25% of topmost word lines in the stack than when the selected word line is below the top portion of the stack.

The delta can be larger when symmetric program pass voltages are applied to the source-side adjacent word line and the drain-side adjacent word line during program pulses of the program operation, than when asymmetric program pass voltages are applied to the source-side adjacent word line and the drain-side adjacent word line during the program pulses of the program operation.

FIG. 16A-16D depicts examples of voltage signals which can be used in a program loop of a program operation, consistent with FIGS. 13 and 14A. The vertical dimension denotes voltage and the horizontal dimension denotes time, with time points t0-t11. The period of time depicted corresponds to one program loop and includes a pre-charge phase 1690 (t0-t2), a program phase 1691 (t2-t8) and a verify phase 1692 (t8-t11). Example voltages of the signals are also depicted. A voltage signal 1600 represents VWLn, the voltage of the selected word line, a voltage signal 1610 represents Vwl_unsel, a voltage of unselected word lines, a voltage signal 1620 represents the select gate voltages, e.g., Vsgd and/or Vsgs, and a voltage signal 1630 represents Vbl, a bit line voltage.

FIG. 16A depicts voltages applied to a selected word line. The voltage signal 1600 is represented by a plot 1601 at an initial voltage such as 0 V, a plot 1602 representing a program pass voltage, Vpgm-pass, a plot 1603 representing a peak level of Vpgm, and a plot 1604 representing verify voltages of VvE, VvF and VvG, for example, for use in the verify phase. A program pulse comprises the plots 1602 and 1603 in the program phase 1691.

FIG. 16B depicts voltages applied to unselected word lines. The voltage signal 1610 is represented by a plot 1611 at an initial voltage such as 0 V. During the program phase, a plot 1612 represents a Vpgm-passL, a low program pass voltage and a plot 1613 represents a Vpgm-passH, a high program pass voltage. During the verify phase, a plot 1611 represents Vverify-passH, a high verify pass voltage, during the application of VvA, the verify voltage of the lowest programmed state, from t8-t9. Plots 1615 and 1616 represent Vverify-passL (a low verify pass voltage) and Vverify-passH, respectively, during the application of VvB and VvC, the verify voltages of other, higher programmed states.

The plot 1614 shows the case of symmetric verify pass voltages, where WLn-1 and WLn+1 receive the same voltage. This plot may also represent the voltage on the remaining unselected word lines. The plots 1615 and 1616 shows the case of asymmetric verify pass voltages for WLn-1 and WLn+1. The plot 1616 may also represent the voltage on the remaining unselected word lines.

A sensing operation occurs for the WLn memory cells assigned to the A, B and C states, respectively, during the application of VvA, VvB and VvC, respectively.

Figure 16C:
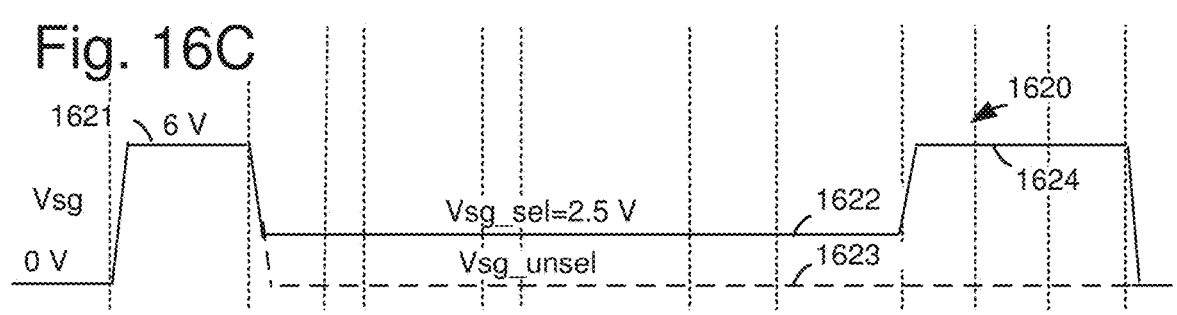

FIG. 16C depicts voltages applied to select gate transistors. The voltage signal 1620 is represented by a plot 1621 during the pre-charge for selected and unselected select gate transistors. The selected select gate (SG) transistors are in a selected sub-block (a sub-block selected for programming), and the unselected SG transistors are in unselected sub-blocks (sub-block which are not selected for programming) Subsequently, a plot 1622 with Vsg_sel=2.5 V represents the voltage of the selected SG transistors, and a plot 1623 with Vsg_unsel=2.5 V represents the voltage of the unselected SG transistors.

Figure 16D:
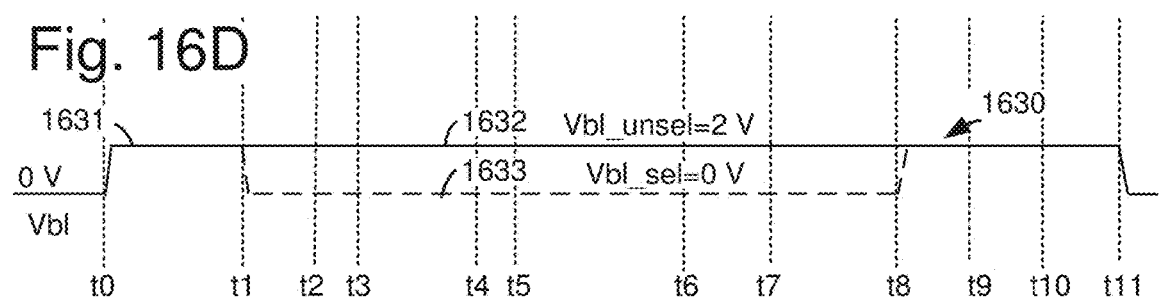

FIG. 16D depicts voltages applied to bit lines. The voltage signal 1630 is represented by a plot 1631, depicting a voltage Vbl=2 V, during the pre-charge for selected and unselected bit lines. The selected and unselected bit lines are connected to selected and unselected NAND strings, respectively, in a selected sub-block, in one approach. Subsequently, a plot 1632 depicts Vbl_unsel=2 V (a voltage on unselected bit lines), and a plot 1633 depicts Vbl_sel=0 V (a voltage on selected bit lines).

In the pre-charge phase, a positive Vbl (plot 1631) is provided to the drain-side of the channels of the strings to remove residue electrons and to provide a small amount of boosting such as 1-2 V. The SGD transistors of the selected and unselected sub-blocks are in a conductive state at this time, with a voltage of 6 V, for example. This allows the bit line voltage to be passed to the drain end channel. It is also possible for the SGS transistors of the selected and unselected sub-blocks to be in a conductive state at this time, with a voltage of 6 V, for example (plot 1631) to allow the source line voltage (Vsl) to be passed to the source end of the channel In the program phase, VWLn and Vwl_unsel are ramped up, e.g., starting at t2, to provide a capacitive coupling up of the channels of the unselected NAND strings. VWLn is then ramped up further at t4-t5 to the peak program pulse level of Vpgm and held at Vpgm until t7. After the program pulse, VWLn is ramped down to Vss (0 V). Subsequently, in the verify phase, one or more verify tests are performed by applying one or more control gate read voltages (plot 1604) on WLn and, for each read voltage, sensing the conductive state of the memory cells in the selected NAND strings of the selected sub-block.

During the program and verify phases, Vsg_sel can be set to, e.g., 2.5 V and 0 V, respectively, for the selected sub-block (plot 1622) and the unselected sub-blocks (plot 1633). During the program pulse, with Vbl=0 V (plot 1633), Vsg_sel is high enough to provide the SG_sel transistors in a conductive state for the selected NAND strings. However, it is low enough that the SG_sel transistors can be provided in a non-conductive state for the unselected NAND strings, by setting a high Vbl for those strings. During the program and verify phases, Vbl_unsel can remain high at 2 V for the unselected NAND strings (plot 1632). Vbl_sel can be increased during the verify phase (t8-t11) as part of a sensing process in which the bit lines are charged up.

During the verify phase, the SGD transistor is in a strongly conductive state to allow sensing to occur for the selected memory cell. Thus, the drain-end select gate transistor is in a conductive state during the pre-charge phase and the program phase, for the selected NAND strings. Vsg_unsel is decreased to a reduced level such as 0 V which provides the SG_unsel transistors in a non-conductive state for the strings in the unselected sub-blocks. After the verify phase, at t11, Vbl is decreased to 0 V so that the SGD transistors are cutoff and the channel region has a floating voltage.

This example shows VWLn increasing in a first step from 0 V to Vpass (an intermediate level, between the initial voltage and the peak voltage) and then in a second step from Vpass to Vpgm. Other embodiments are possible. For example, VWLn may increase to an intermediate level different than Vpass. In another example, VWLn may increase to Vpgm in more than two steps. In another example, VWLn may increase from 0 V to Vpgm in a single step. Although, a single step is typically avoided because it would cause a large increase in the channel gradient and potentially a large amount of the injection type of program disturb.

FIG. 17A-17D depicts examples of voltage signals which can be used in a read operation, consistent with FIGS. 13 and 14B. The vertical dimension denotes voltage and the horizontal dimension denotes time, with time points t0-t12. The period of time depicted corresponds to a read operation for three pages of data. In particular, a lower page of data is read in the time period 1790 from t1-t3 using the read voltages VrA and VrE, a middle page of data is read in the time period 1791 from t5-t8 using the read voltages VrB, VrD and VrF, and an upper page of data is read in the time period 1792 from t10-t12 using the read voltages VrC and VrG.

A voltage signal 1700 represents VWLn, the voltage of the selected word line, a voltage signal 1710 represents Vwl_unsel, a voltage of unselected word lines, a voltage signal 1720 represents the select gate voltages, e.g., Vsgd and/or Vsgs, and a voltage signal 1730 represents Vbl, a bit line voltage.

Figure 17A:
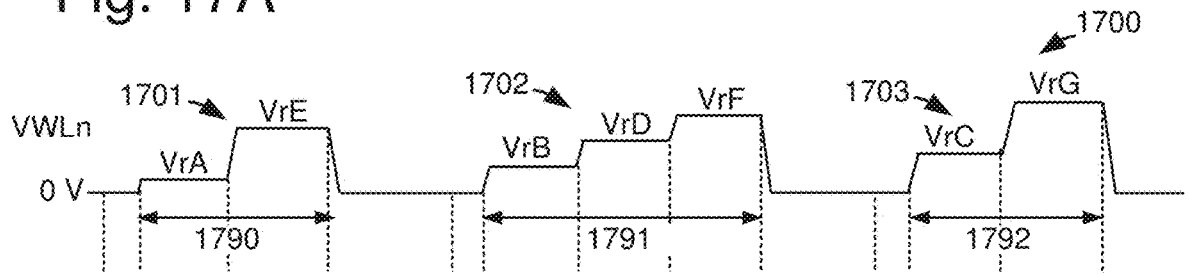
FIG. 17A-17D depicts examples of voltage signals which can be used in a read operation, consistent with FIGS. 13 and 14B.

FIG. 17A depicts voltages applied to a selected word line. The voltage signal 1700 has an initial voltage of 0 V, is increased to VrA and then to VrE (plot 1701) for the lower page read, and is then returned to 0 V. The voltage signal is then increased to VrB and then VrD and VrF (plot 1702) for the middle page read, and is then returned to 0 V. The voltage signal is then increased to VrC and then VrG (plot 1703) for the upper page read, and is then returned to 0 V. Sensing occurs during the application of each control gate read voltage for the memory cells connected to WLn.

Figure 17B:
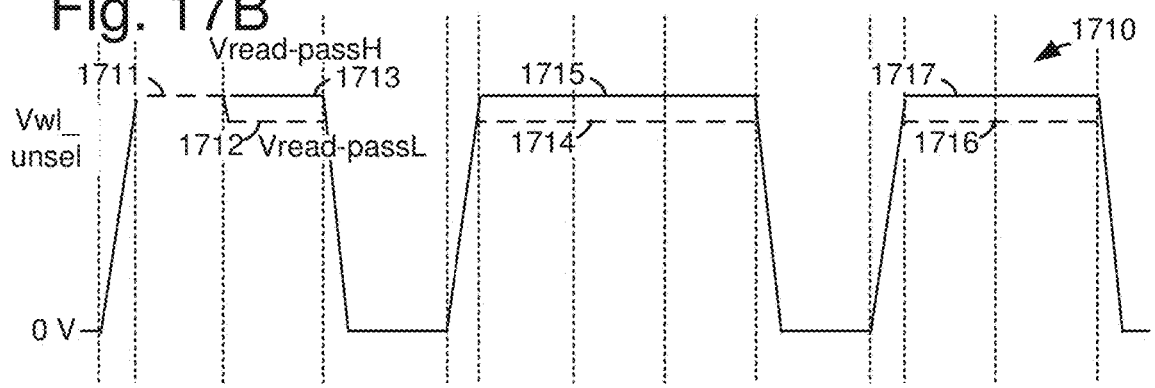

FIG. 17B depicts voltages applied to unselected word lines. During the application of VrA, a plot 1711 denotes a high read pass voltage, Vread-passH. During the application of VrE, plots 1712 and 1713 denote Vread-passL (a low read pass voltage) and Vread-passH, respectively. In one implementation, plot 1711 indicates that Vread-passH is applied to WLn−1 and WLn+1 during the application of VrA. Vread-passH can also be applied to the remaining unselected word lines. Plots 1712 and 1713 indicates that asymmetric read pass voltages are applied to WLn−1 and WLn+1. Vread-passH may also be applied to the remaining unselected word lines.

During the application of VrB, VrD and VrF, plots 1714 and 1715 denote the asymmetric read pass voltages for WLn−1 and WLn+1, respectively. Vread-passH may also be applied to the remaining unselected word lines. During the application of VrC and VrG, plot 1716 and 1717 denote the asymmetric read pass voltages for WLn−1 and WLn+1, respectively. Vread-passH may also be applied to the remaining unselected word lines.

Figure 17C:
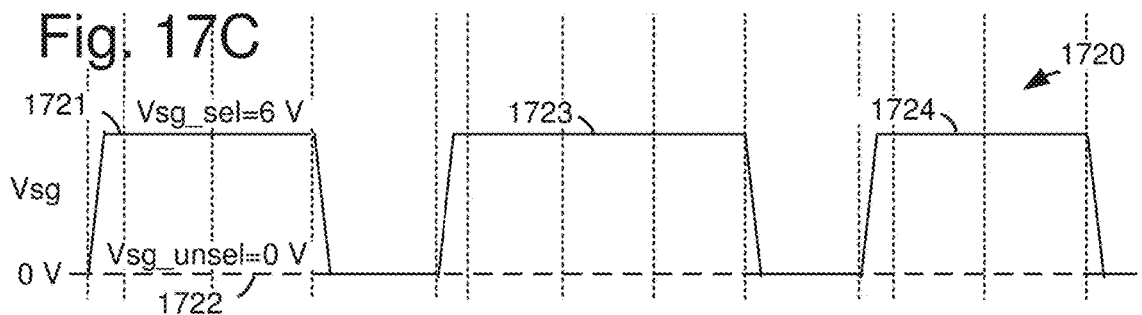

FIG. 17C depicts voltages applied to select gate transistors. The voltage signal 1720 is represented by plots 1721, 1723 and 1724 during the lower, middle and upper page reads, respectively, for the selected sub-block in which the read operation occurs. The selected select gate (SG) transistors are provided in a conductive state to allow sensing to occur. The voltage signal 1722 is provided for the select gate transistors of the unselected sub-blocks. These select gate transistors are provided in a non-conductive state to avoid interfering with the sensing in the selected sub-block.

Figure 17D:
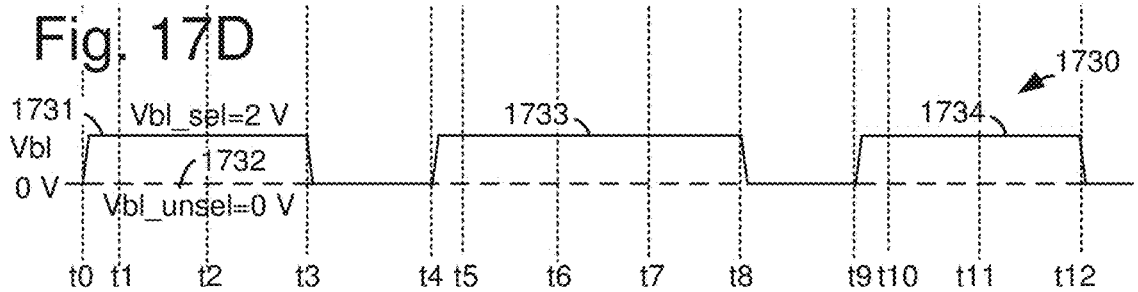

FIG. 17D depicts voltages applied to bit lines. The voltage signal 1730 is represented by plots 1731, 1733 and 1734 depicting a voltage Vbl=2 V, for the selected bit lines during the reading of the lower, middle and upper pages, respectively. This Vbl allows sensing to occur, as discussed in connection with FIG. 2, for the selected sub-block. A plot 1732 depicts a voltage of 0 V which does not allow sensing to occur. In some cases, all of the memory cells are read so that the plot 1732 is not used.

A sensing operation occurs for the WLn memory cells assigned to the A, B and C states, respectively, during the application of VvA, VvB and VvC, respectively.

FIG. 18 depicts plots of Vth margin versus VWLn−1_read pass for low and high temperatures, for low, medium and high levels of Vread pass, and for the three cases discussed in connection with FIG. 12. To achieve a better Vth margin benefit without a Vth upshift for the Er state memory cells, the NWI countermeasure described herein are applied. Vread_pass is the read pass voltage applied to WLn+1 during a read operation for WLn. The top row of plots is for a relatively low Vread pass such as 8.2 V. The middle row of plots is for a medium level of Vread pass such as 8.4 V. The bottom row of plots is for a relatively high Vread_pass such as 8.8 V. Additionally, the nine plots on the left hand side are for a low temperature, e.g., below 40 C, and the nine plots on the right hand side are for a high temperature, e.g., above 40 C. Each of the eighteen plots has a common vertical axis which represents a Vth margin, and a common horizontal axis which represents VWLn−1_read pass. A higher Vth margin is preferable.

At lower temperatures, plots 1801-1803 denote the Vth margin for cases 1-3, respectively, with Vread_pass=low, plots 1804-1806 denote the Vth margin for cases 1-3, respectively, with Vread_pass=medium, and plots 1807-1809 denote the Vth margin for cases 1-3, respectively, with Vread_pass=high. Vth margin generally increases and then turns down as VWLn−1_read pass decreases, except for plot 1809 where Vth margin generally decreases as VWLn−1_read pass decreases. This indicates how VWLn−1_read pass can be set to an optimal level to maximize the Vth margin for a given temperature and Vread_pass.

At higher temperatures, plots 1810-1812 denote the Vth margin for cases 1-3, respectively, with Vread_pass=low, plots 1813-1815 denote the Vth margin for cases 1-3, respectively, with Vread_pass=medium, and plots 1816-1818 denote the Vth margin for cases 1-3, respectively, with Vread_pass=high. Vth margin generally increases as VWLn−1_read pass decreases for the plots of cases 1 and 2. For case 3, Vth margin is mainly flat (plot 1812) or turns down slightly (plots 1815 and 1818) as VWLn−1_read pass decreases.

The Vth margin tends to turn down sooner at the low temperature compared to the high temperature as VWLn−1_read pass decreases. This is because the word line voltages have to be higher to turn on the memory cells.

In one implementation, an apparatus comprises: a set of memory cells arranged in NAND strings and connected to a set of word lines, the set of word lines comprise a selected word line, a source-side adjacent word line of the selected word line, and a drain-side adjacent word line of the selected word line; and a control circuit. The control circuit configured to perform a program operation and subsequently perform a read operation for memory cells connected to the selected word line, the control circuit configured to determine voltages for the source-side adjacent word line and the drain-side adjacent word line during the program operation and during the read operation, the voltages are configured to compensate for interference to the memory cells connected to the selected word line due to programming of memory cells connected to the drain-side adjacent word line.

In another implementation, a method comprises: performing a program operation for memory cells connected to a selected word line, the performing the program operation comprises setting a voltage for a source-side adjacent word line of the selected word line which is not lower than a voltage for a drain-side adjacent word line of the selected word line by at least a delta during a verify test for a lowest programmed data state, and is lower than the voltage for the drain-side adjacent word line by at least the delta during a verify test in the program operation for other, higher programmed data states; and subsequently performing a read operation for the memory cells connected to the selected word line, the performing the read operation comprises setting a voltage for the source-side adjacent word line which is not lower than a voltage for the drain-side adjacent word line by at least the delta when the read operation distinguishes between an erased data state and a lowest programmed data state, and is lower than the voltage for the drain-side adjacent word line by at least the delta when the read operation distinguishes between programmed data states.

In another implementation, an apparatus comprises: a set of memory cells arranged in NAND strings and connected to a set of word lines, the set of word lines comprise a selected word line, a source-side adjacent word line of the selected word line, and a drain-side adjacent word line of the selected word line; and a control circuit. The control circuit: (a) to perform a program operation for memory cells connected to the selected word line, is configured to: set a voltage for the source-side adjacent word line which is higher than a voltage for the drain-side adjacent word line by at least a delta during a verify test for a lowest programmed data state, and is not higher than the voltage for the drain-side adjacent word line by at least the delta during a verify test in the program operation for other, higher programmed data states; and (b) to subsequently perform a read operation for the memory cells connected to the selected word line, is configured to set a voltage for the source-side adjacent word line which is higher than a voltage for the drain-side adjacent word line by at least the delta when the read operation distinguishes between an erased data state and a lowest programmed data state, and is not higher than the voltage for the drain-side adjacent word line by at least the delta when the read operation distinguishes between programmed data states.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of memory cells arranged in NAND strings and connected to a set of word lines, the set of word lines comprise a selected word line, a source-side adjacent word line of the selected word line, and a drain-side adjacent word line of the selected word line; and
a control circuit, the control circuit configured to perform a program operation and subsequently perform a read operation for memory cells connected to the selected word line, the control circuit configured to determine voltages for the source-side adjacent word line and the drain-side adjacent word line during the program operation and during the read operation, the voltages are configured to compensate for interference to the memory cells connected to the selected word line due to programming of memory cells connected to the drain-side adjacent word line.

2. The apparatus of claim 1, wherein:
the voltages comprise a voltage for the source-side adjacent word line which is higher during a verify test in the program operation for a lowest programmed data state than during a verify test in the program operation for other, higher programmed data states.

3. The apparatus of claim 1, wherein:
the NAND strings extend vertically in a stack between a top of the stack and a bottom of the stack; and
the voltages comprise a voltage for the source-side adjacent word line which is higher during a verify test in the program operation for a lowest programmed data state than during a verify test in the program operation for other, higher programmed data states, when the selected word line is in a top portion of the stack comprising no more than 25% of topmost word lines in the stack but not when the selected word line is below the top portion of the stack.

4. The apparatus of claim 1, wherein:
the voltages comprise a voltage for the source-side adjacent word line which is higher when the read operation distinguishes between an erased data state and a lowest programmed data state than when the read operation distinguishes between programmed data states.

5. The apparatus of claim 1, wherein:
the NAND strings extend vertically in a stack between a top of the stack and a bottom of the stack; and
the voltages comprise a voltage for the source-side adjacent word line which is higher when the read operation distinguishes between an erased data state and a lowest programmed data state than when the read operation distinguishes between programmed data states, when the selected word line is in a top portion of the stack comprising no more than 25% of topmost word lines in the stack but not when the selected word line is below the top portion of the stack.

6. The apparatus of claim 1, wherein:
the voltages comprise a voltage for the source-side adjacent word line which is not lower than a voltage for the drain-side adjacent word line by at least a delta when the read operation distinguishes between an erased data state and a lowest programmed data state, and is lower than the voltage for the drain-side adjacent word line by at least the delta when the read operation distinguishes between programmed data states.

7. The apparatus of claim 1, wherein:
the NAND strings extend vertically in a stack between a top of the stack and a bottom of the stack;
the voltages comprise a voltage for the source-side adjacent word line which is not lower than a voltage for the drain-side adjacent word line by at least a delta when the read operation distinguishes between an erased data state and a lowest programmed data state, and when the selected word line is in a top portion of the stack comprising no more than 25% of topmost word lines in the stack but not when the selected word line is below the top portion of the stack; and
the voltage for the source-side adjacent word line is lower than the voltage for the drain-side adjacent word line by at least the delta when the read operation distinguishes between programmed data states.

8. The apparatus of claim 1, wherein:
the voltages comprise a voltage for the source-side adjacent word line which is not lower than a voltage for the drain-side adjacent word line by at least a delta when asymmetric program pass voltages are applied to the source-side adjacent word line and the drain-side adjacent word line during program pulses of the program operation, and is lower than the voltage for the drain-side adjacent word line by at least the delta when symmetric program pass voltages are applied to the source-side adjacent word line and the drain-side adjacent word line during the program pulses of the program operation.

9. The apparatus of claim 1, wherein:
the voltages comprise a voltage for the source-side adjacent word line which is not lower than a voltage for the drain-side adjacent word line by at least a delta during a verify test in the program operation for a lowest programmed data state, and is lower than the voltage for the drain-side adjacent word line by at least the delta during a verify test in the program operation for other, higher programmed data states; and
the voltages comprise a voltage for the source-side adjacent word line which is not lower than a voltage for the drain-side adjacent word line by at least the delta when the read operation distinguishes between an erased data state and the lowest programmed data state, and is lower than the voltage for the drain-side adjacent word line by at least the delta when the read operation distinguishes between programmed data states.

10. The apparatus of claim 1, wherein:
the NAND strings extend vertically in a stack between a top of the stack and a bottom of the stack;
the voltages comprise a voltage for the source-side adjacent word line which is not lower than a voltage for the drain-side adjacent word line by at least a delta during a verify test in the program operation for a lowest programmed data state when the selected word line is in a top portion of the stack comprising no more than 25% of topmost word lines in the stack but not when the selected word line is below the top portion of the stack; and
the voltage for the source-side adjacent word line is lower than the voltage for the drain-side adjacent word line by at least the delta during a verify test in the program operation for other, higher programmed data states.

11. The apparatus of claim 10, wherein:
the voltages comprise a voltage for the source-side adjacent word line which is not lower than a voltage for the drain-side adjacent word line by at least the delta when the read operation distinguishes between an erased data state and the lowest programmed data state and when the selected word line is in the top portion of the stack but not when the selected word line is below the top portion of the stack; and
the voltage for the source-side adjacent word line is lower than the voltage for the drain-side adjacent word line by at least the delta when the read operation distinguishes between programmed data states.

12. The apparatus of claim 1, wherein:
the NAND strings extend vertically in a stack between a top of the stack and a bottom of the stack;
the voltages comprise a voltage for the source-side adjacent word line which is not lower than a voltage for the drain-side adjacent word line by at least a delta during a verify test in the program operation for a lowest programmed data state when a temperature is below a threshold but not when the temperature is above the threshold;
the voltage for the source-side adjacent word line is lower than the voltage for the drain-side adjacent word line by at least the delta during a verify test in the program operation for other, higher programmed data states;
the voltages comprise a voltage for the source-side adjacent word line which is not lower than a voltage for the drain-side adjacent word line by at least the delta when the read operation distinguishes between an erased data state and the lowest programmed data state and when the temperature is below the threshold but not when the temperature is above the threshold; and
the voltage for the source-side adjacent word line is lower than the voltage for the drain-side adjacent word line by at least the delta when the read operation distinguishes between programmed data states.

13. A method, comprising:
performing a program operation for memory cells connected to a selected word line, the performing the program operation comprises setting a voltage for a source-side adjacent word line of the selected word line which is not lower than a voltage for a drain-side adjacent word line of the selected word line by at least a delta during a verify test for a lowest programmed data state, and is lower than the voltage for the drain-side adjacent word line by at least the delta during a verify test in the program operation for other, higher programmed data states; and
subsequently performing a read operation for the memory cells connected to the selected word line, the performing the read operation comprises setting a voltage for the source-side adjacent word line which is not lower than a voltage for the drain-side adjacent word line by at least the delta when the read operation distinguishes between an erased data state and a lowest programmed data state, and is lower than the voltage for the drain-side adjacent word line by at least the delta when the read operation distinguishes between programmed data states.

14. The method of claim 13, wherein:
the delta is larger when a temperature is below a threshold than when the temperature is above the threshold.

15. The method of claim 13, wherein:
the delta is larger when symmetric program pass voltages are applied to the source-side adjacent word line and the drain-side adjacent word line during program pulses of the program operation, than when asymmetric program pass voltages are applied to the source-side adjacent word line and the drain-side adjacent word line during the program pulses of the program operation.

16. The method of claim 13, wherein:
the memory cells are in NAND strings;
the NAND strings extend vertically in a stack between a top of the stack and a bottom of the stack; and
the delta is larger when selected word line is in a top portion of the stack comprising no more than 25% of topmost word lines in the stack than when the selected word line is below the top portion of the stack.

17. An apparatus, comprising:
a set of memory cells arranged in NAND strings and connected to a set of word lines, the set of word lines comprise a selected word line, a source-side adjacent word line of the selected word line, and a drain-side adjacent word line of the selected word line;

a control circuit, the control circuit:
  to perform a program operation for memory cells connected to the selected word line, is configured to: set a voltage for the source-side adjacent word line which is higher than a voltage for the drain-side adjacent word line by at least a delta during a verify test for a lowest programmed data state, and is not higher than the voltage for the drain-side adjacent word line by at least the delta during a verify test in the program operation for other, higher programmed data states; and
  to subsequently perform a read operation for the memory cells connected to the selected word line, is configured to set a voltage for the source-side adjacent word line which is higher than a voltage for the drain-side adjacent word line by at least the delta when the read operation distinguishes between an erased data state and a lowest programmed data state, and is not higher than the voltage for the drain-side adjacent word line by at least the delta when the read operation distinguishes between programmed data states.

18. The apparatus of claim 17, wherein:
the voltages comprise a voltage for the source-side adjacent word line which is higher than a voltage for the drain-side adjacent word line by at least a delta when a pass voltage applied to the source-side adjacent word line is less than a pass voltage applied to the drain-side adjacent word line during program pulses of the program operation, and is not higher than the voltage for the drain-side adjacent word line by at least the delta when the pass voltage applied to the source-side adjacent word line is not less than the pass voltage applied to the drain-side adjacent word line during the program pulses of the program operation.

19. The apparatus of claim 17, wherein:
the delta is larger when symmetric program pass voltages are applied to the source-side adjacent word line and the drain-side adjacent word line during program pulses of the program operation, than when asymmetric program pass voltages are applied to the source-side adjacent word line and the drain-side adjacent word line during the program pulses of the program operation.

20. The apparatus of claim 17, wherein:
the delta is larger when a temperature is below a threshold than when the temperature is above the threshold.

\* \* \* \* \*